(12) United States Patent
Wang

(10) Patent No.: US 12,710,703 B2
(45) Date of Patent: Aug. 18, 2026

(54) LITHOGRAPHY SYSTEM AND METHOD INCLUDING THERMAL MANAGEMENT

(71) Applicant: Taiwan Semiconductor Manufacturing Company, Ltd., Hsinchu (TW)

(72) Inventor: Chia-Wei Wang, Taichung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 89 days.

(21) Appl. No.: 18/519,935

(22) Filed: Nov. 27, 2023

(65) Prior Publication Data

US 2025/0172885 A1 May 29, 2025

(51) Int. Cl.
*G03F 7/00* (2006.01)

(52) U.S. Cl.
CPC ...... *G03F 7/70891* (2013.01); *G03F 7/70875* (2013.01)

(58) Field of Classification Search
CPC ............ G03F 7/70891; G03F 7/70875; G03F 7/70866
See application file for complete search history.

(56) References Cited

U.S. PATENT DOCUMENTS 6,098,408 A * 8/2000 Levinson ............... F25B 21/02 62/62
7,177,007 B2 2/2007 Emoto
7,315,347 B2 1/2008 Miyajima
8,638,416 B2 1/2014 Yoshida
8,648,316 B2 2/2014 Pfeifer
9,574,875 B2 * 2/2017 Lee ........................ G01N 25/16
9,632,434 B2 * 4/2017 Ebert, Jr. ............ G03F 7/70808
10,067,418 B2 9/2018 Chang et al.
10,997,706 B2 5/2021 Chen et al.
2008/0204695 A1 8/2008 Schwarzl et al.
2016/0342096 A1 11/2016 Foad
2022/0357676 A1 11/2022 Chang

OTHER PUBLICATIONS

Ban, Chung-Hyun, Park, Eun-Sang, Ha, Ui-Jeong, Lim, Chae-Yun, Oh, Hye-Keun, "Pattern dependent distortion and temperature variation in EUV mask", Proc. SPIE 11147, International Conference on Extreme Ultraviolet Lithography 2019, 111471R (Sep. 26, 2019); doi: 10.1117/12.2536721.
Van de Kerkhof, Yakunin Andrei M., Kvon, Vladimir, Nikipelov, Andrey, Astkhov Dmitry, Krainov, Pavel, and Banine Vadim, "EUV-induced hydrogen plasma and particle release", Radiation Effects and Defects in SOLIDS2022, vol. 177, No. 5-6, 486-512 https://doi.org/10.1080/10420150.2022.2048657.

* cited by examiner

*Primary Examiner* — Hung V Nguyen
(74) *Attorney, Agent, or Firm* — Haynes and Boone, LLP

(57) ABSTRACT

The present disclosure provides a method for lithography system that includes one or more thermal sensors that provide feedback to a thermal management controller. The thermal management controller provides instructions to a thermal regulation component such as a heat exchanger and gas jets to provide cooling of a reticle used in the lithography system.

18 Claims, 12 Drawing Sheets

704'
12'
12"

704
12'
12"

700
702
30
602
502
506B
602B
602A
506A
16
12"
12'
508B
508A

LITHOGRAPHY SYSTEM AND METHOD INCLUDING THERMAL MANAGEMENT

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For these advances to be realized, similar developments in IC processing and manufacturing are needed. For example, the need to perform higher resolution lithography processes grows. One lithography technique is extreme ultraviolet (EUV) lithography. The EUV lithography employs scanners using light in the extreme ultraviolet region, having a wavelength of about 1-100 nm. EUV scanners use reflective rather than refractive optics, i.e., mirrors instead of lenses. However, while existing lithography techniques have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
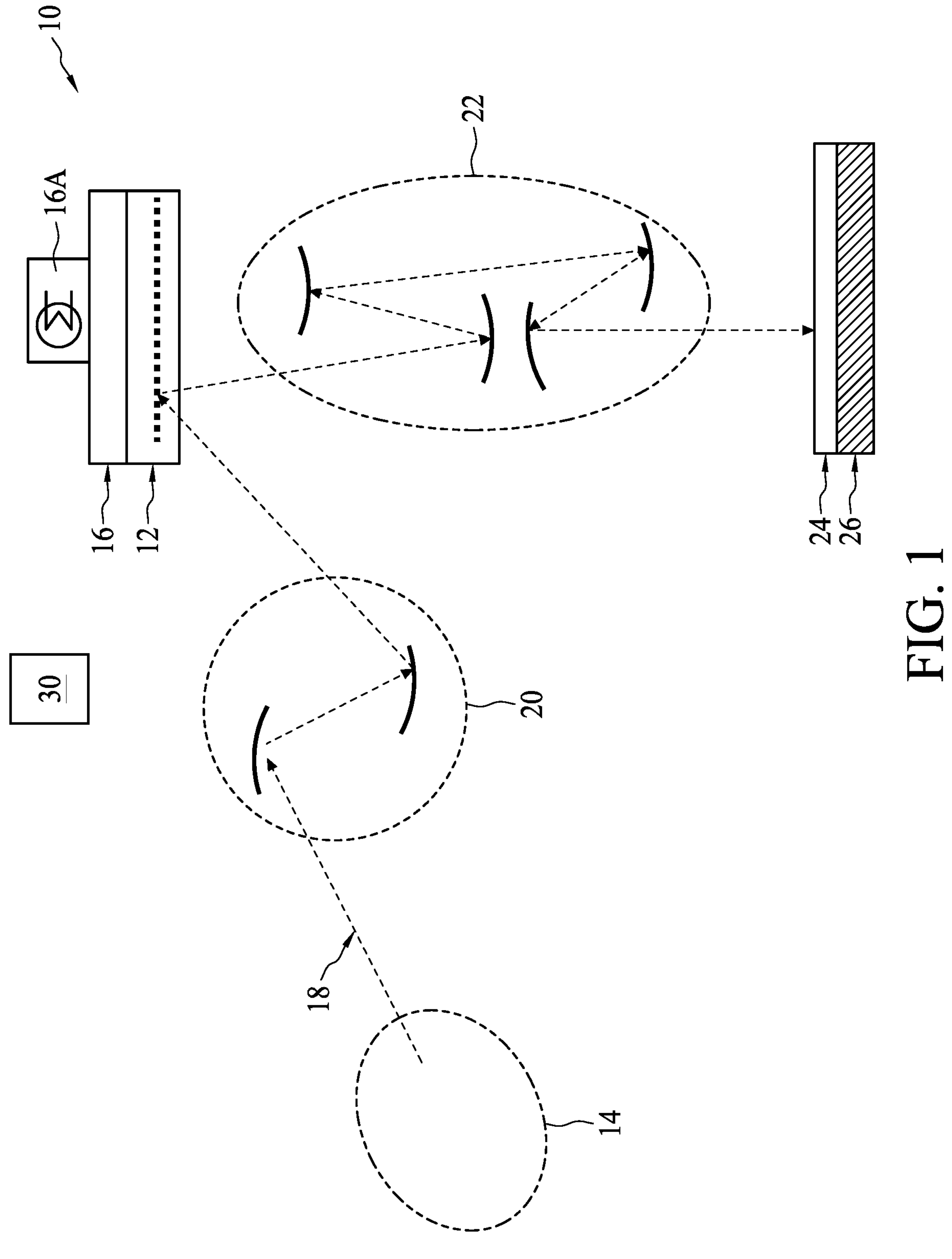
FIG. 1 is a block diagram of an embodiment of a lithography system with a thermal control module, constructed in accordance with some embodiments.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one feature relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described, or other values as understood by person skilled in the art. For example, the term "about 5 nm" encompasses the dimension range from 4.5 nm to 5.5 nm.

The present disclosure includes embodiments about an extreme ultraviolet (EUV) lithography apparatus integrated with an EUV control system that is designed to monitor, analyze, and/or control the EUV lithography apparatus and the methods that it performs for enhanced performance through thermal management. The present disclosure also includes a method using the control system to monitor thermal conditions and actively tune and control aspects of the EUV lithography apparatus such that the lithography process is improved in some implementations when the EUV lithography apparatus is used in integrated circuit (IC) fabrication. Especially, the method and EUV control system are associated with EUV lithography apparatus for patterning IC structures in advanced technology nodes. The IC structure may include field-effect transistors (FETs), fin-type FETs (FinFETs) or multiple gate devices, such as gate-all-around (GAA) devices according to various embodiments.

However, while the present disclosure provides exemplary systems and methods implementing EUV lithography, it should be appreciated that lithography utilizing other wavelengths and other processing steps may benefit from aspects of the present disclosure. Thus, the present disclosure includes thermal management of other systems including other lithography systems.

FIG. 1 is a block diagram of a lithography system 10, constructed in accordance with some embodiments. The lithography system 10 may also be generically referred to as a scanner that is operable to perform lithography exposing processes with respective radiation source and exposure mode. In an embodiment, the lithography system 10 is an extreme ultraviolet (EUV) lithography system designed to expose a target resist layer by EUV light where the resist layer is a suitable material sensitive to the EUV light.

In an embodiment, the lithography system 10 includes an EUV source 14 (or simply referred to as a source 14) to generate EUV radiation 18. In some implementations, the radiation source 14 employs a laser produced plasma (LPP) mechanism to generate plasma and further generate EUV light from the plasma. For example, the radiation source 14 may include one or more laser, such as pulse carbon dioxide laser, to generate a laser beam. In some implementations, the laser source includes two laser devices, one to generate pre-pulse hitting on a target material or droplet, and another to generate main-pulse hitting on the target material. The laser may further include one or more laser amplifiers to further amplify the power of the laser beam. In an implementation, the laser beam is directed through a transparent window integrated with a collector (also referred to as an EUV collector). The collector is designed with proper coating materials and shape, functioning as a mirror for EUV collection, reflection and focus. In some embodiments, the coating material of the collector is similar to the reflective multilayer of an EUV mask such as discussed below.

As introduced above, in implementations, the laser beam is directed to heat a target material or droplet, thereby generating high-temperature plasma, which further produces EUV radiation (or EUV light) 18. In an embodiment, the target material is Tin (Sn). The collector reflects and focuses the EUV radiation 18 for the lithography exposing processes including those discussed with reference to the system 10 below.

The generated EUV radiation 18 is processed through a series of optics referred to as optics train before reaching a target substrate. As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multilayer mirrors, near-normal incidence mirrors, grazing incidence mirrors, specular reflectors, diffuse reflectors and combinations thereof. Moreover, unless otherwise specified, the term "optic", as used herein, is not meant to be limited to components which operate solely within one or more specific wavelength range(s), such as at the EUV. However, for ease of explanation, an embodiment of the system 10 directed to EUV wavelength is discussed herein. As part of the optics train, the system 10 includes an illuminator 20. In various embodiments directed to EUV lithography, the illuminator 20 includes reflective optics, such as a single mirror or a mirror system having multiple mirrors in order to direct radiation 18 from the radiation source 14 towards a mask 12. The illuminator 20 may include a field facet (FF) mirror and a pupil facet (PF) mirror. The facet mirrors are optical elements that may be used to generate a homogenization of the radiation 18 generated by the EUV source 14.

After passing the illuminator 20, the radiation 18 is provided such that it is incident an exposed surface of the mask 12. In the disclosure, the terms of mask, photomask, and reticle are used to refer to the structure 12 that provides a patterning of the incident radiation 18.

The lithography system 10 includes a mask holder 16 (also referred to as a stage or chuck) configured to hold, secure, and position the mask 12. In some embodiments, the mask stage 16 includes an electrostatic chuck (e-chuck) to secure the mask 12. Thus, an e-clamp may be used to secure the mask 12 to the mask stage 16. In some embodiments, the mask stage 16 includes one or more clamps for securing the mask 12. In an embodiment, the mask stage 16 includes one or more thermal regulation components 16A to provide a cooling or decrease in temperature to the mask stage 16, the mask 12 held by the mask stage 16, and/or the surrounding environment. The thermal regulation component 16A may be operably coupled to a thermal control system 30 discussed below. The thermal regulation component 16A may include heat exchangers, coolant (gas or liquid), solid cooling module(s), thermal piping module(s), and/or other thermal management components. In an embodiment, the thermal regulation component 16A includes coolant. In an embodiment, thermal regulation component 16A operates without coolant. The thermal regulation component 16A may provide for reducing a temperature of the mask 12 and/or its surrounding environment (reticle mini-environment). This reduction in temperature can maintain the mask 12 and the layers formed thereon to a temperature that reduces outgassing, for example reducing the breakage of bonds between atoms of a layer of the mask 12 due to the reduction of thermal energy available. The mask holder 16 in some embodiments includes temperature sensors (e.g., thermal couples) used to provide temperature useful to understanding the functioning of the thermal regulation components. In certain embodiments, the system 10 may also include other thermal regulation components such as gas jets or nozzles (discussed below) providing a gas in the reticle environment.

In an embodiment, the mask 12 is a reflective mask suitable for EUV lithography patterning. The mask 12 of the system 10 is briefly discussed. The mask may include a substrate with a reflector (or a reflective layer) such as a multi-layer mirror (MLM) disposed on a substrate. An absorptive layer may be disposed on the MLM. Generally, regions of the mask where the absorptive layer is present absorb incident radiation, whereas regions of the mask where the absorptive layer is not present reflect incident radiation towards a target. The mask 12 may include a substrate with a suitable material, such as a low thermal expansion material (LTEM) or fused quartz, upon which the MLM and absorptive layers are formed. In some embodiments, an EUV pellicle is positioned over the mask 12. The EUV pellicle provides a thin membrane that protects the EUV mask from contaminant particles or other things that could damage the mask. The EUV pellicle is typically coupled to the EUV mask through one or more frames. In some embodiments, there is no EUV pellicle.

The lithography system 10 also includes projection optics (sometimes referred to as projection optics box (POB)) 22 as a portion of the optics train. The projection optics 22 serve to image the pattern of the mask 12 on to a target substrate 24, such as a semiconductor wafer, which is secured on a substrate stage 26 of the lithography system 10. In the case of an EUV lithography embodiment, the projection optics 22 may include reflective optical components, including monolithic mirrors and/or mirror arrays. The projection optics may include a pupil phase modulator. The EUV light, which carries the image of the pattern defined on the mask 12, is directed from the mask 12 and is collected by the projection optics 22. The illuminator 20 and the projection optics 22 are sometimes collectively referred to an optical module of the lithography system 10.

After the projection optics 22, the patterned radiation beam is then delivered to a target substrate 24. Like the optics train and mask discussed above, a target substrate may be provided in an exposure chamber also maintained in a vacuum environment to reduce undesired absorption of radiation 18. The exposure chamber may include a wafer stage 26 to secure a semiconductor substrate (such as a wafer). In various embodiments, the target substrate 24 includes a semiconductor wafer, such as a silicon wafer, germanium wafer, silicon-germanium wafer, III-V wafer, or other type of wafer as described above or as known in the art. The target substrate 24 may be coated with a resist layer sensitive to the radiation of source 14 (e.g., an EUV resist layer). The radiation incident the substrate 24 is such that the image of the pattern or portion thereof defined on the mask 12 is directed onto the semiconductor substrate, or specifically onto the resist layer (also referred to as a photoresist layer), which is coated on a surface of the semiconductor substrate. Portions of the photosensitive resist layer that are exposed to the radiation undergo a chemical transition making them either more or less sensitive to a developing process.

In some implementations, the mask 12 and the substrate 24 may be provided in a same environment (e.g., are each within a contiguous vacuum environment). That is, because that gas molecules absorb EUV light, the EUV chamber or portions thereof may be subject to a vacuum environment to avoid EUV intensity loss. There may be a contiguity between the photoresist and the reticle which may increase a likelihood of contamination between the substrate 24 and the mask 12. Aspects of the present disclosure may serve to reduce the contamination as discussed herein.

The lithography system 10 also includes a thermal control system or module 30 coupled to or integrated with the lithography system 10. The thermal control module 30 is designed with mechanisms to monitor various parameters of the EUV lithography apparatus including temperatures, collect information from various databases, analyze the collected data and/or parameters, perform simulations, and/or actively tune or control variables of the lithography system 10. In some implementations, the thermal control module 30 to provide instructions to perform thermal control management of the lithography process provided in the lithography system 10. In some implementations, the thermal control module 30 provides instructions to tune or control the thermal regulation components including 16A. In some embodiments, the lithography system 10 includes a gas supply module designed to provide gas to the system. In an embodiment, the gas supply module may be operably coupled to the thermal control module 30. The gas supply module may be instructed to provide gases suitable for the thermal management of the lithography system 10.

The thermal control module 30 includes various units, sensors, modules, and components integrated and configured to perform various functions including collect data for the thermal control module 30. In an embodiment, the thermal sensors providing information to the thermal control module 30 comprise thermal couple, IR camera/sensor, UV sensor, light sensor, and/or other suitable components. Various portions of the thermal control module 30 may be distributed in various locations, such as being partially embedded and configured in the lithography system 10; or being partially standing along and coupled with the lithography system 10 through Internet communication (such as Internet cable connection, WiFi connection, Bluetooth connection, other suitable connection or a combination thereof. The thermal control module 30 may be integrated in with other control systems of the lithography system 10. The thermal control module 30 also includes suitable computer hardware including a processor and storage. The memory storage includes a computer program that the processor carries out including the analysis of the thermal control module discussed herein.

Various components including those described above are integrated together and are operable to perform EUV lithography exposure processes using the lithography system 10. The thermal control module 30 provides for performing a lithography process having thermal management as discussed in further detail below. The lithography system 10 may further include other modules or be integrated with (or be coupled with) other modules.

In some implementations, the lithography system 10 is used to fabricate integrated circuits (IC) or portions thereof. In some implementations, the lithography system 10 is used to form comprise static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, gate-all-around (GAA) devices and/or other devices. The present disclosure is not limited to any particular semiconductor devices.

As discussed above, aspects of the present disclosure are illustrated through an EUV system and/or performance of EUV lithography. However, aspects of the present disclosure may also be provided in other systems and/or for performance of lithography processes at other wavelengths. Thus, in some embodiments, the source 14 generates radiation 18 in a wavelength such as an X-ray, a DUV, an I-line, a G-line, and/or other available wavelengths. Consequently, the components of the optical path include components suitable for the selected wavelength including of mirrors, lens, liquid environments, pellicle mirrors, beam splitters, gratings, phase shifter components, and the like. Similarly, the mask 12 is configured to suitable pattern the provided radiation, for example, providing a phase shift mask, transmissive mask, and/or other suitable masks.

Figures 2A, 2B, 2C:
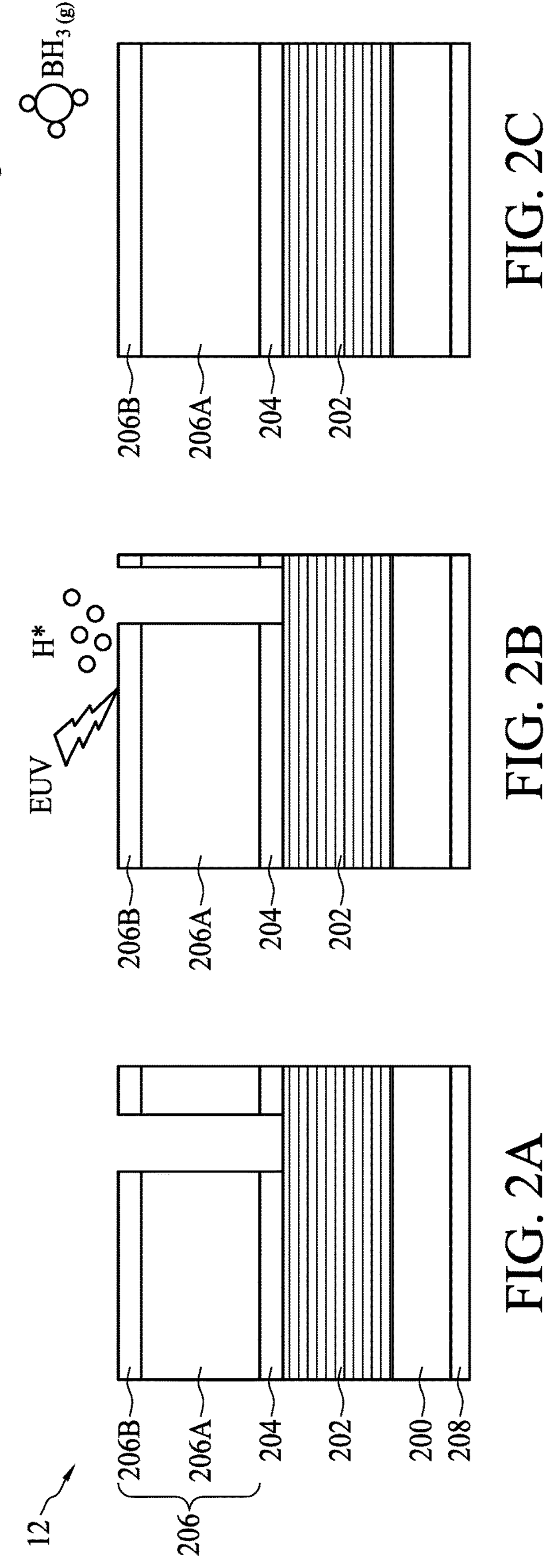
FIG. 2A is a diagrammatic view of an EUV mask fabricated in accordance with some embodiments.
FIGS. 2B and 2C are diagrammatic views of an EUV mask interactions with the environmental conditions of a lithography process in accordance with some embodiments.

Referring now to FIG. 2A, illustrated in further detail is an exemplary mask or reticle 12. The mask 12 may be an EUV mask. In an embodiment as described here, the lithography system 10 is an EUV lithography system, and the mask 12 is a reflective mask used for performing EUV lithography. As such, generally, regions of the mask 12 where an absorber layer 206 is present absorb incident radiation, such as radiation 18, whereas regions of the mask where the absorptive layer is not present reflect incident radiation towards a target thereby providing a patterned radiation 18.

The mask 12 includes a substrate 200 with a suitable material, such as a low thermal expansion material (LTEM) or fused quartz. Exemplary low thermal expansion materials include quartz as well as LTEM glass, silicon, silicon carbide, silicon oxide, titanium oxide, Black Diamond® (a trademark of Applied Materials), TiO2 doped SiO2, and/or other low thermal expansion substances known in the art. Above the substrate 200 is a plurality of reflective layers that form multi-layer (ML) 202. The ML 202 includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The number of layers, the layer thickness, and the layers materials are selected to provide the desired reflectivity based on the exposure radiation and its properties such as wavelength and/or angle of incidence. In an embodiment, a plurality of Mo/Si pairs (e.g., 40 pairs) are formed to provide the reflective layers 202. The ML 202 form a multilayer mirror operable to reflect the incident radiation.

The mask 12 may further include a capping layer 204. In some implementations, the capping layer 204 is disposed on the ML 202 to protect the ML 202 from oxidation. In an implementation, the capping layer 204 is ruthenium (Ru). In an embodiment, the capping layer 204 is between approximately 2 nanometers and 10 nanometers (nm), such as approximately 3.5 nanometers (nm) in thickness. An absorber layer 206 may be formed above the capping layer 204. The absorber layer 206 is patterned according to the desired patterning of the radiation beam associated with the feature to be fabricated on the target substrate. The absorber layer 206 includes a first absorber layer 206A and an overlying second absorber layer (acting as antireflective coating (ARC)) 206B. In some implementations, the absorber layer 206 include boron. Example compositions include but are not limited to TaBN (e.g., 206A) and TaBO (e.g., 206B). In some implementations, the absorber layer also includes other elements (e.g., chromium). In an embodiment, the absorber layer 206A is between approximately 30 nm and 120 nm in thickness, for example 68 nm in thickness. In an embodiment, the ARC layer is between 1 nm and 10 nm in thickness, such as approximately 2 nm.

In some implementations, a conductive backside coating 208 is provided on the opposing side of the substrate 200. The conductive backside coating 208 may be used to secure the mask 12 to an electrostatic chuck such as stage 16 of the lithography system 10 described above with reference to FIG. 1. Thus, in some implementations, this coating 208 is referred to as a chucking layer. Exemplary electrostatic chucking layer materials include chromium nitride (CrN), chromium oxynitride (CrON), chromium (Cr), tantalum boron nitride (TaBN), tantalum silicide (TaSi) and/or other suitable materials.

In FIG. 2B, illustrated is the mask 12 in an environment where a lithography process is being performing utilizing the mask 12. An EUV radiation beam 18 is incident the mask 12 including the absorber layer 206. In an embodiment, the EUV radiation beam 18 has a wavelength centered around 13.5 nm. The mask 12 may be in a vacuum environment. In a further embodiment, hydrogen is available in the environment as illustrated by the representative H atoms of FIG. 2B. In an embodiment, hydrogen radicals are generated by radiation. The incident radiation 18 may, in some instances, provide energy sufficient for boron atoms to be freed from the absorber layer 206. The released boron atoms may bond with the available hydrogen. In some instances, the bonding forms $BH_3$. The formed $BH_3$ may be provided in gaseous form. Other compounds may also be formed including but not limited to diborane. FIG. 2C is illustrative of the formation of $BH_3$, which is referred to as outgassing. Thus, the outgassed $BH_3$ may be present in the lithography system 10, such as in the vacuum chamber including the mask 12.

As indicated with reference to FIG. 1, the mask 12 may be provided in an environment that is contiguous such that it extends from the mask 12 through the projection optics 22 to the substrate 24. In such an implementation, outgassing from the target substrate 24 may intermix with outgassing from the mask 12. Exemplary outgassing from the photoresist include but are not limited to carbon-based components. In some implementations, a photoresist layer on the target substrate 24 produces an outgassing of carbon-based components such as methylamine.

Figure 3:
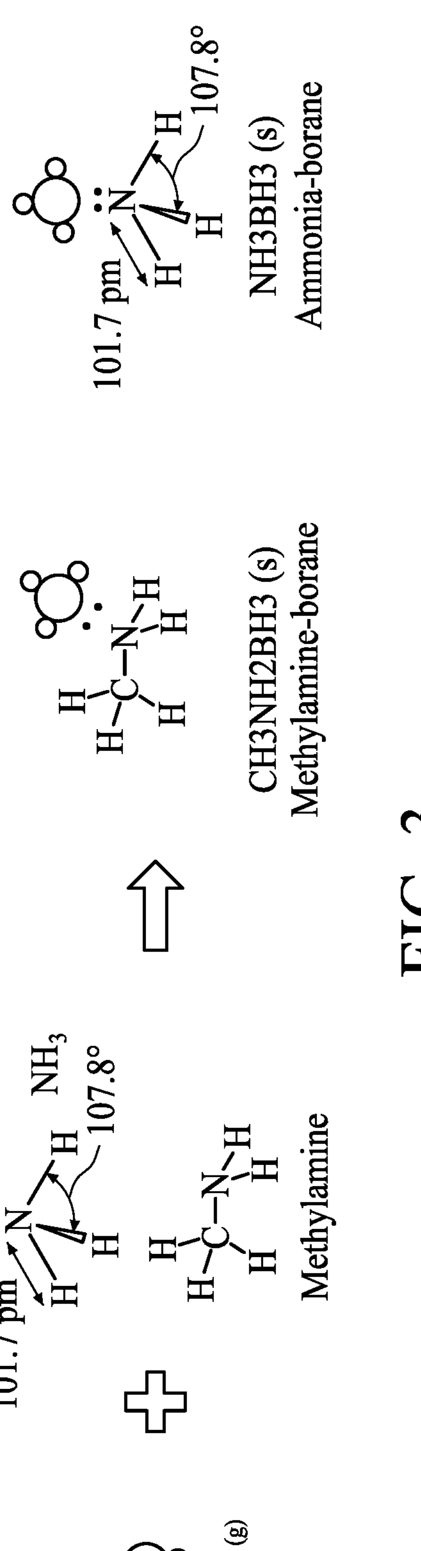
FIG. 3 is an illustration of molecular structures and interactions occurring in a lithography environment, in accordance with some theories of the present disclosure.

The outgassed material from the mask 12 and the outgassed material from the photoresist of the substrate 24 may mix to form undesired compounds that provide contaminates to the system 10 and its components. In the illustrated reaction of FIG. 3, an outgassed component from the mask 12 (e.g., $BH_3$ as illustrated in FIG. 2C) and outgassed compound from the substrate 24 (e.g., methylamine, ammonia) combine to form contaminates such as methylamine-borane and/or ammonia-borane or variants thereof. In some implementations, the formed compounds from the outgassing of the mask 12 and the substrate 24 may react in a gaseous phase to form a solid phase compound. For example, in some implementations, methylamine-borane and/or ammonia-borane are formed in solid phase. The outgassed materials and the products of their reactions may provide contaminates that may attach to the system 10 including but not limited to the chamber sidewalls, mirrors of the optics path, the substrate 24, the mask 12 and/or other features. In some implementations, the byproduct forms a solid phase contaminate that forms on the mask 12 surface, which alters the reflectivity properties of that area of the mask creating a defect interrupting the patterning of the radiation beam. For example, a defect may provide unwanted absorption or reflection creating a defect in the pattern. As the pattern of the mask 12 is repeated across the substrate 24, a single mask 12 defect can greatly affect the yield of devices formed on the substrate 24 as the defect is repeated across the substrate 24.

The present disclosure provides systems and method that in some implementations strive to reduce the outgassing components from the mask 12 to in turn reduce the contamination produced in the system. To reduce the outgassing components from the mask 12, such as a reduction in production of $BH_3$ discussed above, the thermal condition of the mask 12 is monitored and tuned through the thermal management techniques discussed herein. For example, the present disclosure recognizes that less outgassing (e.g., $BH_3$ or derivatives) is produced at a lower temperature of the mask 12. Thus, in some implementations, the outgassing from the mask 12 produced during lithography process is reduced by managing (e.g., lowering the temperature) the thermal conditions of the mask holder 16, the mask 12 itself, and/or the surrounding environment of the mask 12. Thus, the thermal management serves in some implementations to provide for lower outgassing by restraining the production of boron into the environment by reducing the amount of boron freed from the absorber and/or reducing the boron-nitride reaction(s). It is noted that the nature of EUV lithography and the reflective mask 12 means some percentage of the EUV power is absorbed in the EUV mask increasing its temperature. The thermal management of the present disclosure recognizes and addresses this otherwise increase in temperature.

In some studies, it has been illustrated that over half of the defects on an EUV mask in a lithography system such as the system 10 discussed above are from compounds including boron and nitride. Thus, implementations of the present embodiments that reduce the boron outgassing can serve to benefit the quality of EUV lithography process by removing a reactant of the defect-inducing compounds. It is noted that this discussion is for purposes of understanding only and unless specifically captured by the claims that follow, the present disclosure is not bound to any theory or resultant contaminate level.

Figure 4:
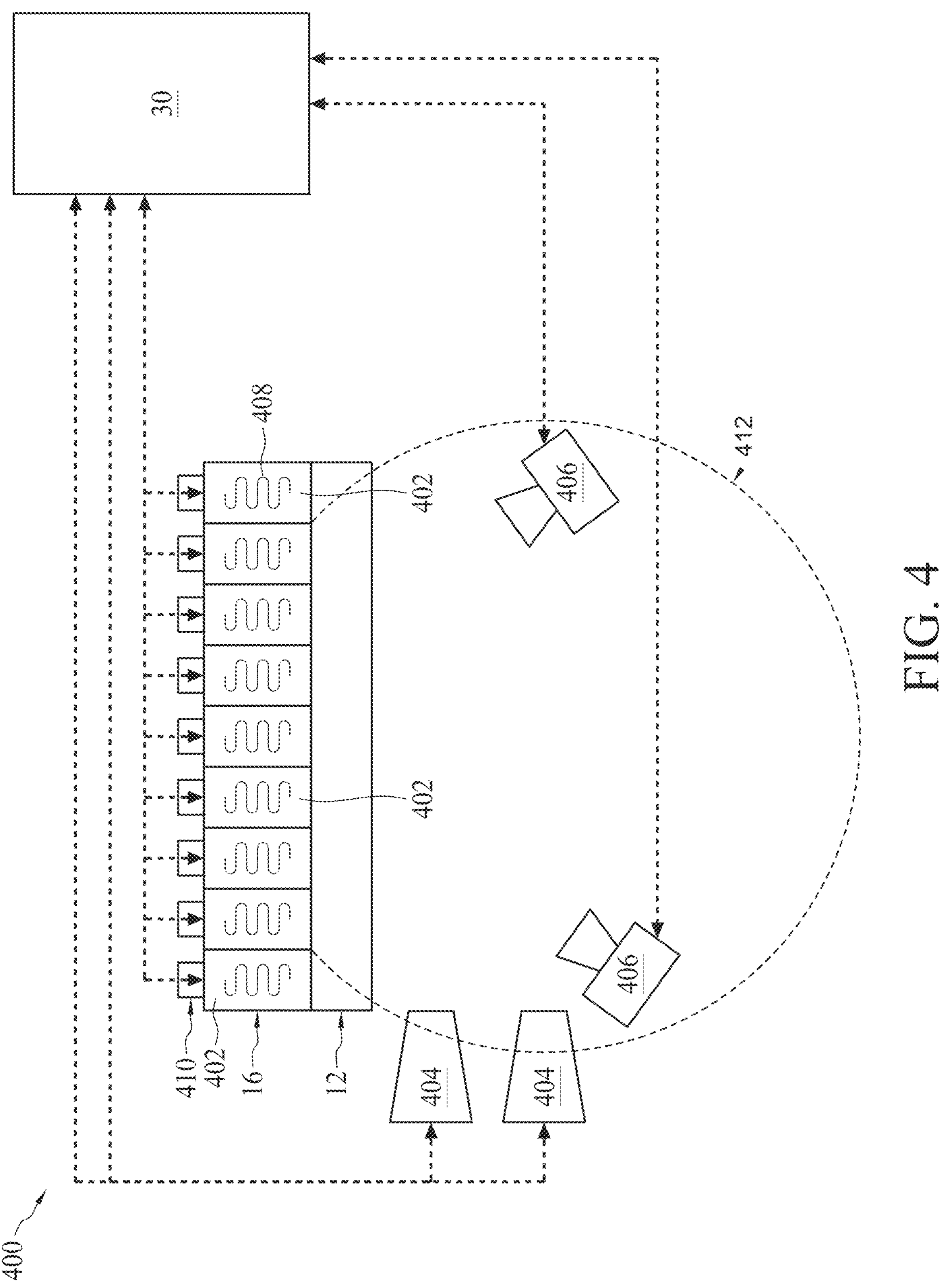
FIG. 4 is a block diagram of an embodiment of a lithography system having a thermal control module according to some implementations of the present disclosure.

Referring to FIG. 4, illustrated is a block diagram of a system 400 including a mask 12 and a mask holder (or stage or chuck) 16. The system 400 may be included in a lithography system such as the lithography system 10 discussed above with reference to FIG. 1. In an embodiment, the mask 12 is an EUV mask, substantially similar to as discussed above with respect to FIG. 2A.

The mask stage 16 is separated into a plurality of regions or zones 402. The zones 402 are portions of the mask stage 16 that individually tunable or configurable. In an implementation, the zones 402 are individually configurable to provide a different thermal control. In an embodiment, one or more thermal regulation components are provided in each zone 402. Each of the zones 402 is coupled to the thermal control module 30. In an embodiment, the thermal control module (or simply controller) 30 provides instructions to a given zone 402 to achieve a desired temperature setpoint. Each zone 402 may include a component operable to reduce the temperature of the zone—a thermal regulation component 408—heat exchangers, coolant (gas or liquid), solid cooling module(s), thermal piping module(s), and/or other cooling components. Each zone 402 may also include a temperature sensor 410. In some implementations, each zone 402 includes a direct temperature sensor 410 such as a thermal couple. The thermal couple includes an electrical device that produces a temperature-dependent voltage that can be correlated to a temperature.

The mask stage 16 may include a single zone 402, or any number of a plurality of zones 402. In an implementation, there are two zones 402 in a given stage 16. In other implementations, an array of zones 402 are provided. Each zone 402 corresponds to a particular physical portion of the stage 16 and thus, a particular physical region of the mask 12 held by the stage 16. The thermal control module 30 individually monitors (e.g., using feedback from sensor 408, 410) each zone 402 for temperature, as well individually controls each zone for temperature by providing instructions to thermal regulation components 408 in the stage, such as heat exchangers, coolant (gas or liquid), solid cooling module(s), thermal piping module(s), and thermal regulation components apart from the stage 16, such as the gas jets described below.

To that effect, the system 400 also includes one or more gas jets (or nozzles) 404. In an embodiment, the system 400 includes a plurality of gas jets 404 each coupled to the thermal control module 30. The gas jets 404 are operable to deliver a flowrate of a gas. Exemplary gases include but are not limited to H, He, Ar, N, and/or combinations thereof. In some implementations, the gas jets 404 provide hydrogen. Hydrogen is provided as a suitable gas because of its anti-oxidation, carbon-cleaning properties, and/or its high EUV transmission. In an embodiment, the gas jets 404 deliver a gas flow operable to cool one or more components of the system 400. In some implementations, the gas jets 404 provide a gas flow below room temperature. In an embodiment, there are a plurality of gas jets 404 are each individually tunable or configurable by the thermal control module 30. In an implementation, the gas jets 404 are individually configuration to provide a gas at a different flow rate and/or a gas at a different temperature. In an embodiment, the thermal control system 30 provides an instruction to the gas jets 404 directing a flow rate and/or gas temperature based on a thermal management plan (e.g., cooling) desired for the mask 12.

The system 400 also includes a plurality of sensors 406. The sensors 406 may be IR sensor (also referred to as an IR camera), UV sensor, light sensor, and/or other suitable components. The sensors 406 may be referred to as a remote temperature sensing device due to its lack of direct contact with a body it is measuring. The plurality of sensors 406 may be operable to determine a temperature of the mask 12, the stage 16 and/or one or more of the zones 402, and/or a temperature in an environment surrounding the mask 12 illustrated as a portion of the mask environment 410. In an embodiment, the sensors 406 are infrared (IR) temperature sensors.

In an embodiment, each zone 402 has an associated a remote temperature sensing device such as IR sensor that is operable to provide the temperature associated with that zone 402. In an embodiment, each zone 402 has an associated a direct temperature sensing device 410 such as thermal couple that is operable to provide the temperature associated with that zone 402. In an embodiment, the number of each sensor 406 and/or 410 is equal to the number of zones 402. For example, the controller 30 may receive temperature information from a first sensor 406 that the controller 30 uses to provide an instruction to a first zone 402 thermal regulation component and/or the gas jets 404 to provide for thermal cooling of the first zone. The gas jets 404, the thermal regulation components 408 of the zones 402, and the sensors including remote sensors 406 and direct sensors 410 such as thermal couples on the stage 16, together with the controller 30, provide a thermal management system. The thermal management system may be implemented in an EUV lithography system such as the system 10 described in FIG. 1. In some implementations, the thermal management system is operable to measure and configure or tune the temperature of the mask 12 such that there is a reduction in outgassing from the mask 12 into the mask environment 410 during a lithography process.

Referring now to FIGS. 5, 6, 7A, 8A and 9, illustrated are embodiments of a system 500, 600, 700, 800, and 900 respectively that provide for thermal management of a mask or reticle. The systems 500, 600, 700, 800, and 900 are illustrative embodiments of implementations of the system 400 described with reference to FIG. 4. Each of the systems 500, 600, 700, 800, and 900 may include additional components and/or one or more components may be omitted.

Figure 5:
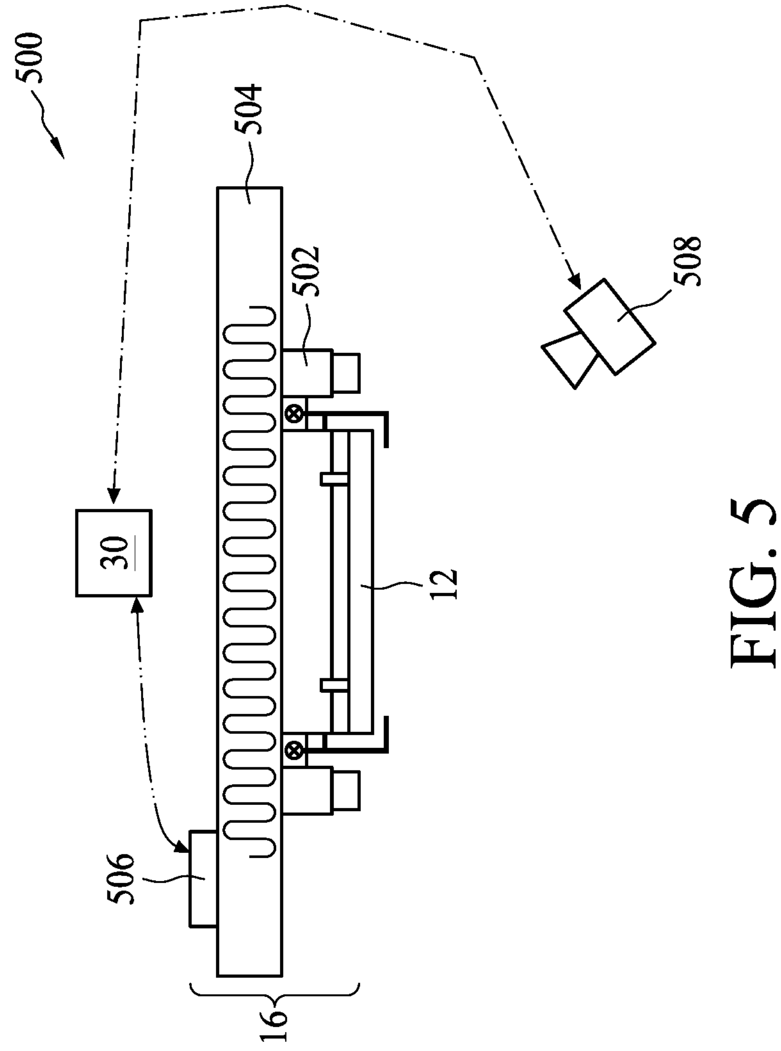
FIGS. 5, 6, 7A, 8A, and 9 are diagrammatic views of different embodiments implementing features of thermal control management according to some aspects of the present disclosure.

Illustrated in FIG. 5, the system 500 includes a mask 12, which may be substantially similar to the mask 12 discussed above. In an embodiment, a top layer of the mask 12 is provided for incident radiation (i.e., the surface facing downward in FIG. 5). In an embodiment, the top layer includes boron.

In an embodiment, the mask 12 is secured to the stage 16 by an electrostatic potential. Other embodiments are possible including where a clamp affixes the reticle to the stage 16.

In an embodiment, the stage 16 can be moved in X, Y and/or Z directions by way of a positioning element 502. In some embodiments, the positioning element 502 includes one or more actuators that can move the stage 16 in a prescribed direction by a prescribed distance. In some embodiments, the actuators include stepper motors, piezo-electric actuator, short stroke motors, and/or other features. In some embodiments, the positioning element 502 is coupled to or includes a controller to control the one or more stepper motors and/or piezo actuators such that a desired movement of the stage 16.

The stage 16 also includes a thermal regulation component 504. The thermal regulation component 504 may include a heat exchanger, piping or channels providing coolant, a solid cooling module, thermal piping module(s), and/or other thermal cooling components and/or other thermal management components. In an embodiment, the thermal regulation component 504 includes coolant. The coolant may be a gas or liquid. In an embodiment, the thermal regulation component 504 operates without coolant. In the illustrated embodiment, the thermal regulation component 504 is positioned on an opposing side of the positioning element 502 from the mask 12, however other configurations are possible. The thermal regulation component 504 may be substantially similar to the thermal regulation component 16A of the system 10 and/or the thermal regulation component 408 of the system 400.

A thermal couple 506 is positioned on the stage 16. In an embodiment, a thermistor or other temperature measurement device is used instead and/or in addition to the thermal couple 506. The thermal couple 506 is operable to sense a temperature of the stage 16. The thermal couple 506 is coupled to the thermal control module 30 and provides the thermal control module 30 with temperature data relating to the portion of the stage 16 it is positioned on. In lieu of or in addition to the thermal couple 506, the temperature may be sensed by other direct sensors (e.g., thermistors) or indirect measurement components such IR camera/sensor, UV sensor, light sensor, and/or other suitable components.

An IR module or sensor 508 is positioned adjacent to and a distance from the stage 16. The IR module 508 maybe substantially similar to the sensor 406 described above with reference to FIG. 4. In an embodiment, the IR module 508 provides temperature readings of the mask 12, portions of the stage 16, and/or the surrounding environment. The IR module 508 is coupled to the thermal control module 30 and provides the thermal control module 30 with temperature data. In lieu of or in addition to the IR module 508, the temperature may be sensed by other indirect sensing components such as an UV sensor, light sensor, and/or other suitable components operable to sense a temperature remotely.

Based on the information received from the thermal couple 506 and the IR module 508, as well as other information (e.g., lithography scanning and timing data, mask 12 information, ambient condition data including ambient temperature, lithography parameters (such as discussed below)), the thermal control module 30 instructs the thermal regulation component 504 operatively coupled thereto to regulate (e.g., decrease) the temperature of the mask 12 such as by providing additional cooling.

Figure 6:
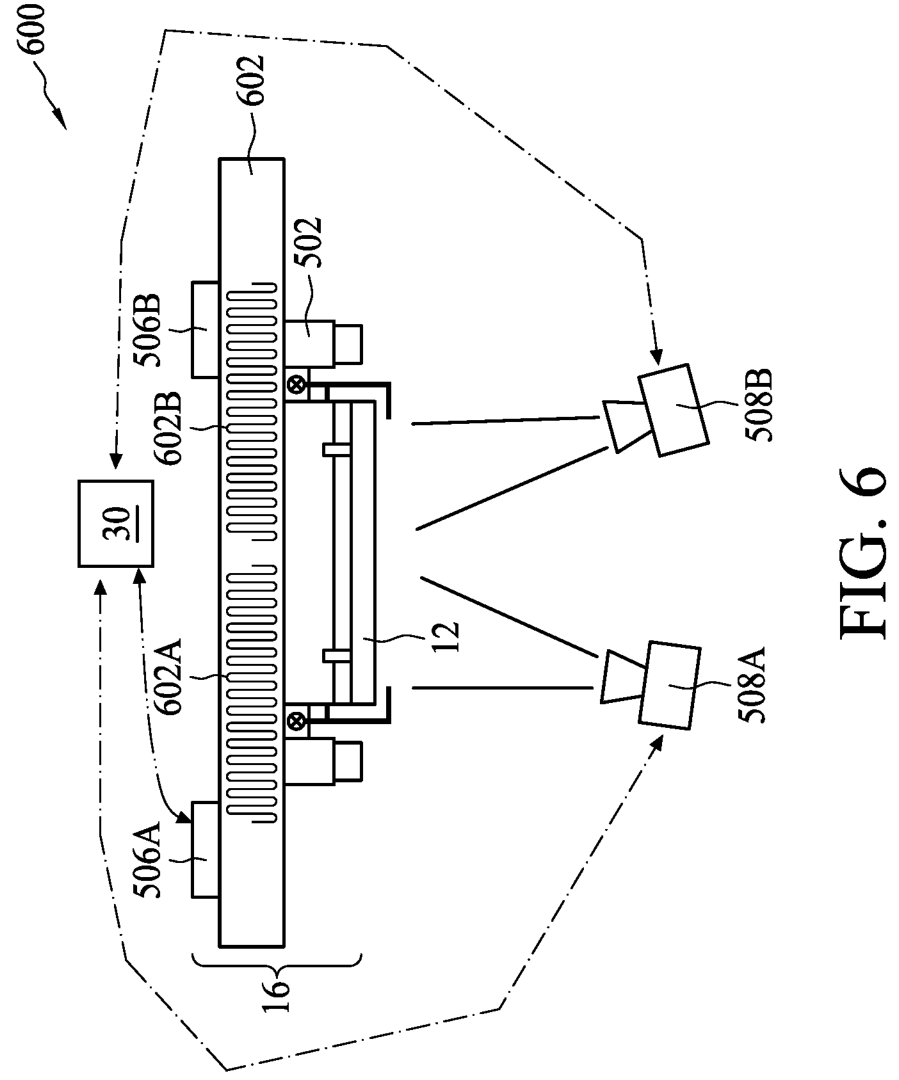

The system 600 of FIG. 6 includes many similar components the system 500 such as the mask 12 and mask stage 16. However, in the system 600, the stage 16 includes a plurality of thermal regulation components 602. The thermal regulation components 602 may include a heat exchanger, piping or channels providing coolant, and/or other thermal cooling components. In an embodiment of the system 600, two thermal regulation components 602A and 602B are provided. However, any number of thermal regulation components may be provided as discussed above with reference to the zones 402. In the illustrated embodiment, the thermal regulation component 602 is positioned on an opposing side of the positioning element 502 from the mask 12, however other configurations are possible. In the illustrated embodiment, the thermal regulation component 602A is positioned over a first half of the mask 12 (e.g., left) and the thermal regulation component 602B is positioned over a second half of the reticle (e.g., right).

A plurality of thermal couples 506 (506A, 506B) are positioned on the stage 16. In an embodiment, other temperature sensing devices such as a thermistor are used instead or and/or in addition to the thermal couples 506. A first thermal couple 506A is positioned on a first portion (e.g., left) of the stage 16 and a second thermal couple 506B is positioned on a second portion (e.g., right) of the stage 16. The thermal couple 506A is operable to sense a temperature of the first region of the stage 16; the thermal couple 506B is operable to sense a temperature of the second region of the stage 16. The thermal couples 506 are each coupled to the thermal control module 30 and provide the thermal control module 30 with temperature data relating to the portion (or zone) of the stage 16 it is positioned on.

A plurality of IR modules 508 are positioned adjacent the stage 16. The IR module 508 maybe substantially similar to the sensor 406 described above with reference to FIG. 4. In an embodiment, the IR module 508 provides temperature readings of the mask 12, portions of the stage 16, and/or the surrounding environment. In an embodiment, the IR module 508A provides information on a first portion of the mask 12, stage 16, and/or surrounding environment; the IR module 508B provides information on a second portion of the mask 12, stage 16, and/or surrounding environment. The IR modules 508A and 508B are each coupled to the thermal control module 30 and provides the thermal control module 30 with temperature data.

Based on the information received from the thermal couple 506A, thermal couple 506B, the IR module 508A, the IR module 508B, as well as other information (e.g., lithography scanning and timing data, mask 12 information, ambient condition data including ambient temperature), the controller 30 instructs each of the thermal regulation component 602A and the thermal regulation component 602B operatively coupled thereto to control the components in a desired manner in order to regulate the temperature of the first portion and the second portion of the mask 12. Different instructions may be sent to each of the thermal regulation component 602A and the thermal regulation component 602B. For example, in an embodiment, the mask 12 information considered by the thermal control module 30 includes the pattern density of the mask 12. In an embodiment, the first portion (e.g., left) of the mask 12 has a first pattern density and the second portion (e.g., right) of the mask 12 has a second pattern density. For example, the first portion may have a greater pattern density than the second portion. In such an embodiment, the controller 30 may provide instructions to the thermal regulation component 602A to provide additional cooling in comparison with the instructions provided to the thermal regulation component 602B. In other words, in some embodiments, the thermal control module 30 provides instructions to the thermal regulation component 602A to provide cooling greater than the cooling instructions provided to the thermal regulation component 602B.

Figures 7A, 7B, 7C:
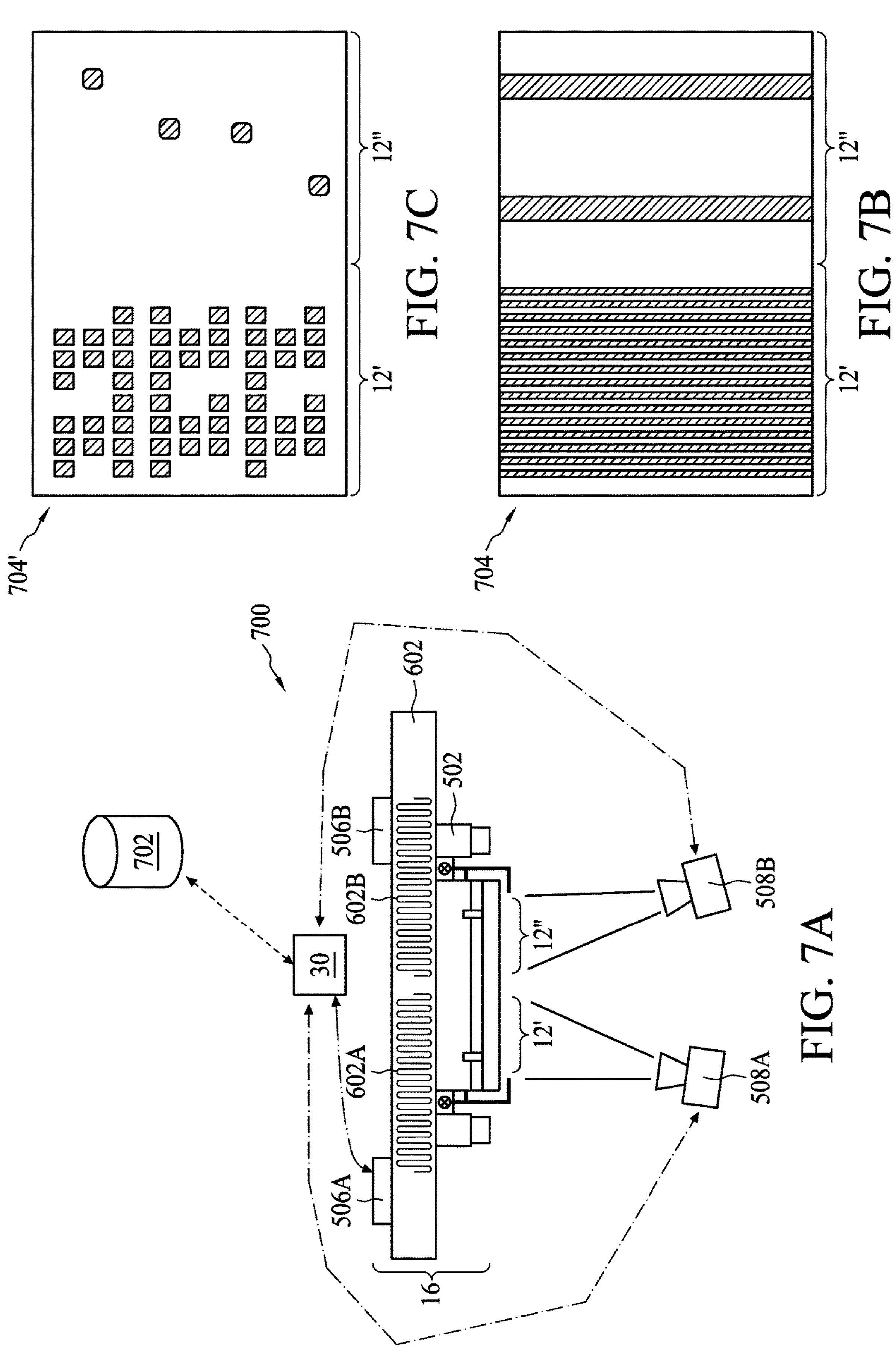
FIGS. 7B and 7C are diagrammatic illustrations of exemplary design data that may be used in aspects of the present disclosure.

The system 700 of FIG. 7A is similar to the system 600 discussed in FIG. 6 and likewise includes the mask 12 disposed on the stage 16, which may be substantially similar to as discussed above. The stage 16 also includes a plurality of thermal regulation components 602, in the illustrated embodiment of the system 700, two thermal regulation components 602A and 602B. In the illustrated embodiment, the thermal regulation component 602A is positioned over a portion 12' of the mask 12 and the thermal regulation component 602B is positioned over a portion 12" of the mask 12. A plurality of thermal couples 506 and IR modules 508 are included in the system 700. The thermal couples 506 and the IR modules 508 may be substantially similar to as discussed above. While two of the thermal regulation components 602, thermal couples 506 and IR modules 508 are illustrated, any number are possible.

The thermal control module or controller 30 is operably coupled to a database 702. The database 702 includes a physical structure, such as a memory device with input and output for data transferring in and out. Examples of the memory device includes a non-volatile memory (NVM) device, such as flashing memory device or ferroelectric random-access memory (RAM), a volatile memory, such as static RAM (SRAM) device, other suitable memory device, or a combination thereof.

The database 702 may include pattern density information associated with the mask 12. In an embodiment, the pattern density information is design data related to the device(s) to be fabricated using the mask 12. The design data may be information on the design and layout of the chips formed using the mask 12 such as the design data found in a GDS file. In an embodiment, the database 702 includes information on the pattern density of the mask 12 as illustrated by exemplary design data 704 of FIG. 7B. In an embodiment, the design data 704 illustrates a greater pattern density at region 12' than at region 12". In a further embodiment, the features of the design data 704 define active regions, such as a fin of a FinFET transistor. FIG. 7C illustrates another exemplary embodiment of design data 704' used to form the mask 12. In an embodiment, the design data 704' illustrates a greater pattern density at region 12' than at region 12". In a further embodiment, the features define contact elements of a transistor.

In the implementation of an EUV mask, the features of the design data 704 may be defined by the patterned absorber layer. The pattern density of the mask 12 may be determined by the ratio of absorber such as absorber layer 206 described above with reference to FIG. 2A, to the exposed reflective ML such as ML 202, also described above with reference to FIG. 2A. In an embodiment, the thermal control module 30 is operable to provide a calculated pattern density based on the design data that is stored in the database 702.

Based on the information received from the thermal couples 506, the IR modules 508, and the database 702, the thermal control module 30 calculates and sends instructions for each of the thermal regulation component 602A and the thermal regulation component 602B operatively coupled thereto. The instructions control the thermal regulation components in a desired manner in order to regulate (e.g., reduce) the temperature of the first portion 12' and the second portion 12" of the mask 12. Different instructions may be sent to each of the thermal regulation component 602A and the thermal regulation component 602B. In an embodiment, first portion 12' has a first pattern density (see FIGS. 7B and 7C) and the second portion 12" has a second pattern density (see FIGS. 7B and 7C) less than the first pattern density. In such an embodiment, the thermal control module 30 may provide instructions to the thermal regulation component 602A to provide additional cooling in comparison with the thermal regulation component 602B.

The thermal control module 30 may include an analysis module that has various correlation analysis units that analyze the correlations among various parameters, such as a correlation between the pattern density and the heat generation. In some implementations, the analysis module of the thermal control module 30 recognizes that the greater the pattern density of a region of the reticle the greater heat is generated during an EUV lithography process. In other words, exposure of first portion 12' generates more heat than exposure of second portion 12". By providing additional cooling instructions to the thermal regulation component 602A, the system 700 can compensate for the additional produced heat. In an embodiment, the additional cooling serves to reduce the temperature of the first portion 12' and thereby decrease the production of outgassing such as $BH_3$. It is noted that the mask 12 is illustrated as including two regions 12' and 12". However, any number of regions or zones is possible. In some implementations, the number of regions dictates the number of thermal couples 506, IR modules 508, and/or thermal regulation components 602.

Figures 8A, 8B:
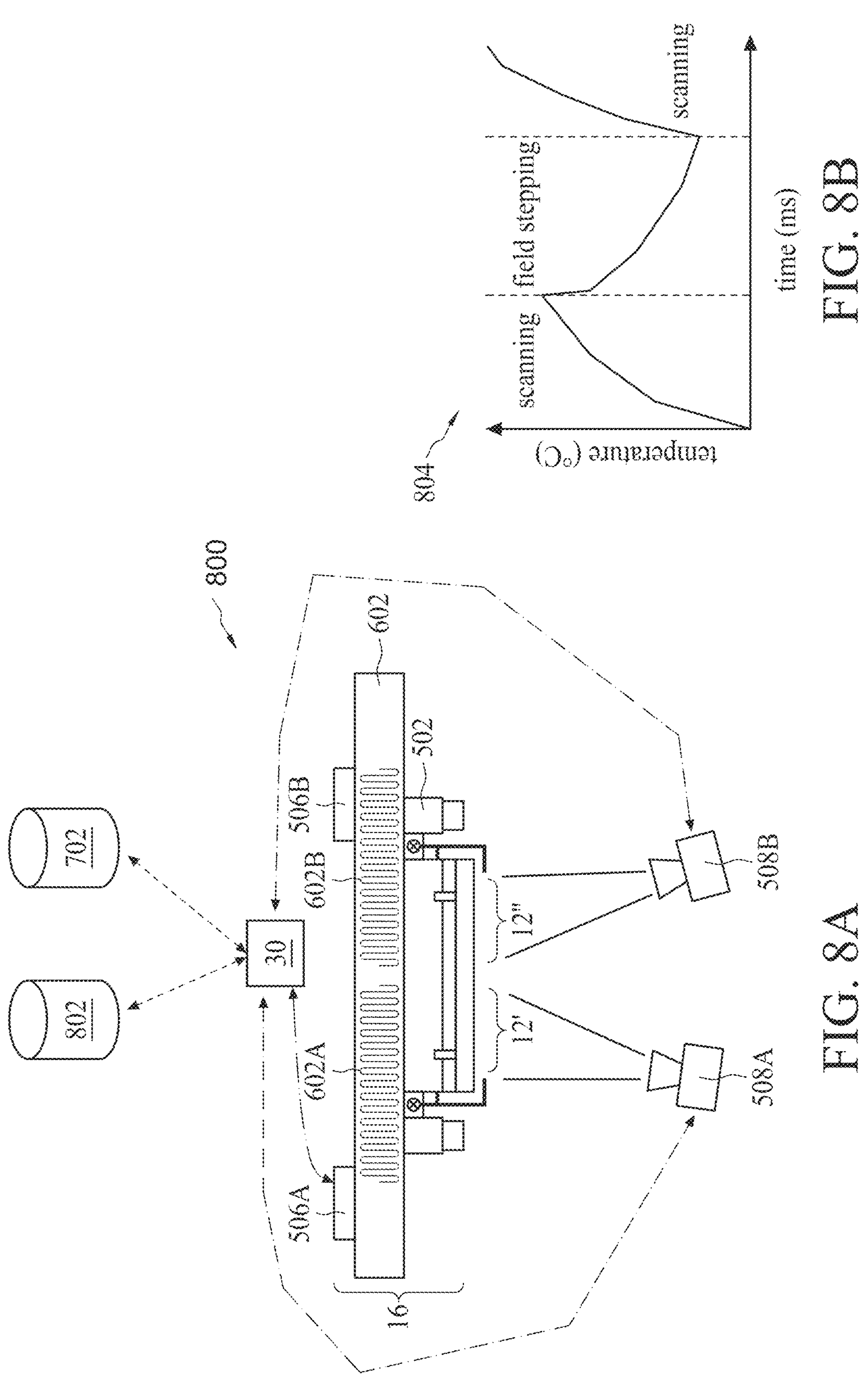
FIG. 8B is a diagrammatic illustration of an exemplary thermal profile implemented in aspects of the present disclosure.

The system 800 of FIG. 8A is substantially similar to the system 700 of FIG. 7A and similarly includes a mask 12 disposed on a stage 16 having a plurality of thermal regulation components exemplified by thermal regulation components 602A and 602B. In the illustrated embodiment, the thermal regulation component 602A is positioned over a portion 12' of the mask 12 and the thermal regulation component 602B is positioned over a portion 12" of the mask 12. A plurality of thermal couples 506 and IR modules 508 are included in the system 800 and may be substantially similar to as discussed above. Again, while two thermal couples 506 and the IR modules 508 are illustrated, any number are possible.

The thermal control module 30 is operably coupled to the database 702, which is substantially similar to as discussed above with reference to FIG. 7A. In an embodiment, as discussed above, the database 702 includes design data indicative of the reticle pattern density. The thermal control module 30 is also operably coupled to a database 802. The database 802 includes a physical structure, such as a memory device with input and output for data transferring in and out. Examples of the memory device includes a non-volatile memory (NVM) device, such as flashing memory device or ferroelectric random-access memory (RAM), a volatile memory, such as static RAM (SRAM) device, other suitable memory device, or a combination thereof. The database 802 may be separate from or integrated with the database 702.

The database 802 may include lithography parameters such as information on the lithography process and/or the mask usage of the lithography process. In an embodiment, the database 802 includes information regarding the exposure parameters to be implemented by the system 800. In an embodiment, the database 802 includes exposure times for regions of the mask 12. In some embodiments, the database 802 includes scanner parameter such as stepping conditions (e.g., timing) and scan time in x or y axis directions. In an embodiment, the database 802 include EUV pulse conditions such as a pulse width (e.g., w nanoseconds), pulse repetition or frequency (e.g., f kHz), power (e.g., p $W/cm^2$), and/or energy (mJ/cm[3]). The database 802 may contain and/or the thermal control module 30 may be operable to calculate energy (E=Pavg/R) and/or Power (e.g., Ppeak=Pavg/R*tau, where R is the repetition rate (e.g., 50 kHz) and tau is the pulse duration (e.g., 150 nm)) of an EUV lithography process. In an embodiment, the database 802 includes the number of EUV pulses requires to melt the droplet (e.g., Sn), which affects the temperature profile of the system. In an embodiment, the database 802 includes temperature profiles (discussed below) that indicate a maximum temperature during the associated scanning conditions.

Based on the information received from the thermal couples 506, the IR modules 508, the database 702, and the database 802, the thermal control module 30 calculates and sends instructions to each of the thermal regulation component 602A and the thermal regulation component 602B operatively coupled thereto to control the components in a desired manner in order to regulate the temperature of the first portion 12' and the second portion 12" of the mask 12 during exposure. Different instructions may be sent to each of the thermal regulation component 602A and the thermal regulation component 602B. As discussed above, in an embodiment, the thermal control module 30 receives from the database 702 information that the reticle portion 12' has a first pattern density (see FIGS. 7B and 7C) and the reticle portion 12" has a second pattern density (see FIGS. 7B and 7C) less than the first pattern density. The pattern density may be used by the analysis module to determine a cooling requirement (e.g., greater pattern density requires greater cooling).

In an embodiment, the thermal control module 30 receives from the database 802 information including temperature profile data associated with a lithography process using a mask 12 in the system 800. In an embodiment, the thermal control module 30 receives from the database 802 information that the thermal control module 30 uses to calculate a temperature profile data associated with a lithography process using a mask 12 in the system 800. In an embodiment, the thermal control module 30 recognizes that lithography process to be performed using the reticle 12 has a scanner stepping condition of a stepping of n milliseconds. The analysis module of the thermal control module 30 may determine a thermal condition (e.g., cooling) caused by the n milliseconds, and/or the thermal condition caused by the n milliseconds is received from the database 802. In an embodiment, the thermal control module 30 recognizes that the lithography process to be performed using the mask 12 has a scan duration of m milliseconds (e.g., received from the database 802). The analysis module of the thermal control module 30 may determine a thermal condition (e.g., heating) caused by the m milliseconds, and/or the thermal condition caused by the m milliseconds is received from the database 802.

In an embodiment, the thermal control module 30 receives from the database 802 temperature profile data and/or an analysis module of the thermal control module 30 may produce temperature profile data (e.g., by simulation) using data from the database 802. The temperature profile data illustrates a thermal condition of a mask or portion thereof over time when exposing said mask, or similarly configured masks, to the lithography process defined by the parameters stored in the database 802. In an embodiment, the thermal control module 30 receives from the database 802 previously acquired data (e.g., by the system 800) illustrating a temperature reading over time when exposing the mask 12 or similarly configured reticles. In an embodiment, the thermal control module 30 includes an analysis module operable to develop a temperature profile including a temperature over time when exposing the mask 12. Exemplary temperature profile data 804 is illustrated in FIG. 8B. The temperature profile data 804 may be used by the analysis module of the thermal control module 30 to determine a cooling requirement over a given time during the exposure process. In an embodiment, the thermal control module 30 provides instructions for the thermal regulation component 602A to provide a first cooling performance during a first duration of an EUV scan of the mask 12 and a second cooling performance during a second duration following the first duration of the EUV scan of the mask 12.

Thus, in the system 800, the thermal control module 30 may include an analysis module includes various correlation analysis units that analyze the correlations among various parameters, such as a correlation between the pattern density and the heat generation, and implements into its analysis data associated with temperature profiles (e.g., gathered by simulation, experimental results, previous product runs, similar reticles or the like) associated with the scan conditions of mask 12. In some implementations, the analysis module of the thermal control module 30 recognizes that the greater the pattern density of a region of the reticle the greater heat is generated during the EUV process. In other words, exposure of reticle portion 12' generates more heat than exposure of reticle portion 12". By providing additional cooling instructions to the thermal regulation component 602A, the system can compensate for the additional produced heat. In some implementations, the analysis module of the thermal control module 30 recognizes that the higher temperatures of the mask 12 are provided during a certain time during the EUV process. By providing additional cooling instructions to the thermal regulation component 602, the system can compensate for the additional produced heat during the appropriate times. In an embodiment, the cooling instructed by the thermal control module 30 serves to reduce the temperature of the mask portion 12 and thereby decrease the production of outgassing such as $BH_3$.

Figure 9:
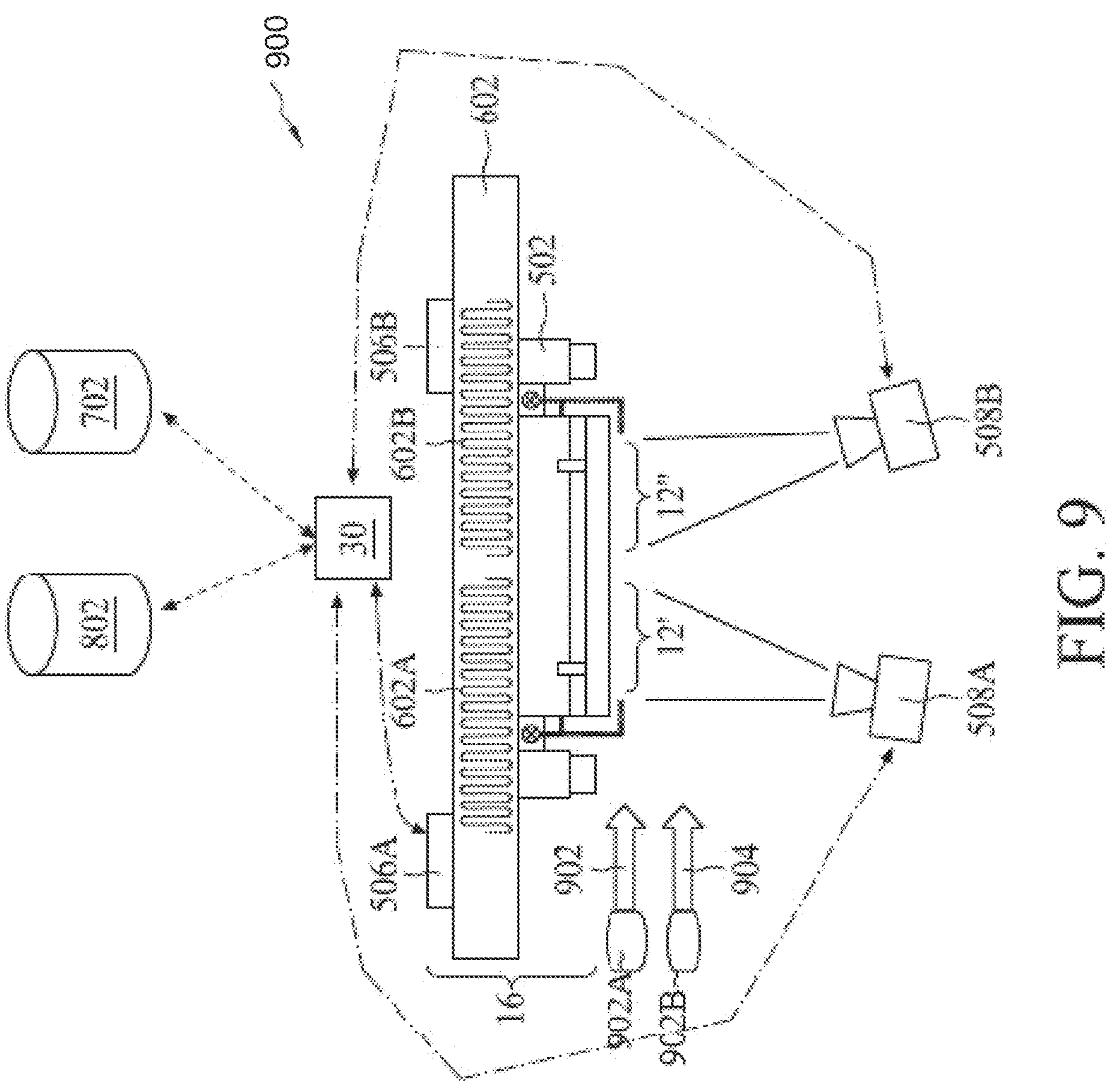

The system 900 of FIG. 9 is similar the system 800 of FIG. 8A including that the mask 12 is disposed on the stage 16, which includes thermal regulation components 602A and 602B. In the illustrated embodiment, the thermal regulation component 602A is positioned over a portion 12' of the mask 12 and the thermal regulation component 602B is positioned over a portion 12" of the mask 12. However, again, the mask 12 may be divided into any number of portions or zones.

A plurality of thermal couples 506 and IR modules 508 are included in the system 900. The thermal couples 506 and the IR modules 508 may be substantially similar to as discussed above. While two thermal couples 506 and the IR modules 508, any number are possible. The thermal control module 30 is operably coupled to the database 702, which is substantially similar to as discussed above with reference to FIGS. 7A, 7B, 7C, and the database 802, which is substantially similar to as discussed above with reference to FIGS. 8A and 8B. In an embodiment, as discussed above, the database 702 includes design data indicative of the mask pattern density. In an embodiment, as discussed above, the database 802 includes temperature profile data indicative of the temperature profile expected in scanning the mask 12 using the system 900. One or more of these components may be omitted in embodiments of the system 900.

The system 900 further illustrates a first gas flow 902 and a second gas flow 904. In an embodiment, the first gas flow 902 is provided from a first gas jet 902A and the second gas flow 904 is provided from a second gas jet 902B. The gas jets may be substantially similar to the gas jets 404, discussed above with reference to FIG. 4. The first gas flow 902 is provided a first distance from the mask 12. The second gas flow 904 is provided a second distance from the mask 12, which may be greater than the first distance. In an embodiment, one or more of the gas flow 902, 904 includes a laminar flow in the x-direction. The gas flow 902 and 904 may both be a same gas (e.g., hydrogen), though this is not required. The gas flow 902 may differ in flowrate from the gas flow 904.

Moreover, the gas flow 902 may differ in temperature from the gas flow 904. For example, in an embodiment, the gas flow 902 may be approximately 2° C. to approximately 20° C. colder than the gas flow 904. In an embodiment, the gas flow 902 and the gas flow 904 are both lower than the ambient temperature (e.g., lower than approximately 22° C.). In an embodiment, the gas flow 902 and/or the gas flow 904 are greater than approximately 0° C. In an embodiment, the gas flow 904 is approximately room temperature (e.g., approximately 22° C.) and the gas flow 902 is lower temperature than the gas flow 904 such as at least 3° C. lower). In an embodiment, the gas flow 902 and 904 are provided at a temperature that condensation does not occur. In some implementations, the reticle chuck pressure is such that condensation does not occur with the provided gas flow 902, 904 reduced temperature. In an embodiment, the reticle chuck pressure may be between approximately 5 Pa and 100 Pa. In a further embodiment, the gas flow includes a gas having phase change triple point provided at approximately 1 kPa and 0° C. The gas temperature may be maintained such that the gas flow remains in the gaseous phase.

The gas flows 902 and 904 and the gas jets 902A and 902B are controlled by the thermal control module 30. In an embodiment, the thermal control module 30 provides instructions related to the flow rate and/or temperature of the gas flows 902 and 904. The thermal control module 30 determines the instructions to the gas flows 902 and 904 using the information provided from the databases 702 and/or 802, the thermal couples 506 and IR modules 508. The thermal control module 30 may determine a desired cooling for the mask 12 is achieved through a combination of the gas flows 902, 904 and the thermal regulation components 602.

Thus, in the system 900, the thermal control module 30 may include an analysis module provides various correlation analysis units that analyze the correlations among various parameters, such as a correlation between the pattern density and the heat generation and implements into its analysis data of previous temperature profiles (e.g., gathered by simulation, experimental results, previous product runs, similar reticles or the like) associated with the scan conditions of mask 12. In some implementations, the analysis module of the thermal control module 30 recognizes that the greater the pattern density of a region of the reticle the greater heat is generated during the EUV process. In other words, exposure of reticle portion 12' generates more heat than exposure of reticle portion 12". By providing additional cooling instructions to the thermal regulation component 602 and/or the gas jets 902A and 902B providing gas flows 902 and 904 respectively, the system can compensate for the additional produced heat. In some implementations, the analysis module of the thermal control module 30 recognizes that the greater heating of the mask 12 is generated during a certain time during the EUV process. By providing additional cooling instructions to the thermal regulation component 602 and/or gas jets 902A and 902B providing the gas flows 902 and 904 respectively, the system can compensate for the additional produced heat during the appropriate times. In an embodiment, the cooling instructed by the controller 30 serves to reduce the temperature of the mask portion 12 and thereby decrease the production of outgassing such as $BH_3$.

Figure 10:
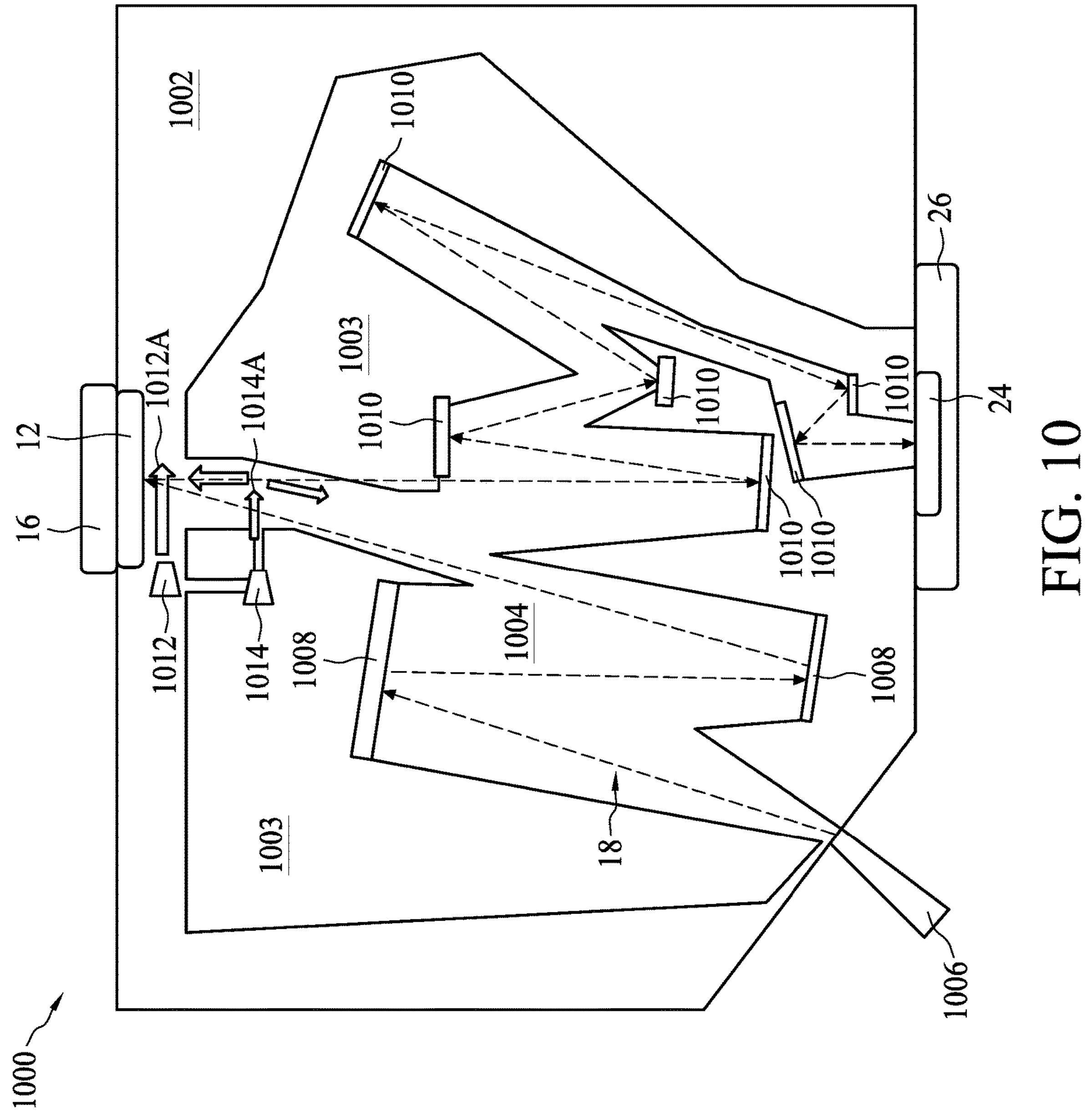
FIG. 10 is a diagrammatic view of an embodiment of an EUV lithography system, according to some aspects of the present disclosure.

FIG. 10 is illustrative of an embodiment of a lithography tool 1000, simplified for ease of understanding. In an embodiment, the lithography tool 1000 is an EUV lithography tool. The lithography tool 1000 may be substantially similar to the system 10, described above with reference to FIG. 1. Further components may be added to the lithography tool 1000, and components may be omitted.

The lithography tool 1000 includes a radiation source 14 that provides a radiation beam 18. In an embodiment, the radiation beam 18 provided by the source 14 has an EUV wavelength. The radiation enters a mini-environment 1004 within a main chamber 1002 of the tool 1000. Within the mini-environment 1004 there are illuminator components 1008 and projection optics (or POB) components 1010. The illuminator components 1008 may include field facets and pupil facets, and in some implementations may be substantially similar to the illuminator 20 discussed above with reference to FIG. 1. The projection optics (or POB) components 1010 may include a plurality of mirrors, and in some implementations may be substantially similar to projection optics 22 discussed above with reference to FIG. 1.

The mini-environment 1004 defines and contains an optical train or path for the radiation 18. Components 1003 defining of the mini-environment include may include components that correct, direct, modify, and/or contain the radiation 18. The mini-environment 1004 may be a vacuum environment.

A plurality of gas nozzles is provided in the tool 1000. A first gas jet 1012, also referred to as a y-nozzle, is provided adjacent the bottom of the mask 12. In some implementations, the gas jet 1012 is included in or amongst the reticle masking (REMA) blades (not shown). A gas flow 1012A is provided from the nozzle 1012. The gas flow 1012A may be substantially similar to the flow from jet 404 in the system 400 of FIG. 4 and/or the gas flow 1012A may be substantially similar to the flow 904 described above with reference to FIG. 9. Exemplary gases of the gas flow 1012A provided from the gas jet 1012 include but are not limited to H, He, Ar, N, and/or combinations thereof. As discussed above, in an embodiment, the gas flow 1012A may be less than room temperature.

A gas jet 1014 is disposed a further distance from the bottom of the mask 12. The gas jet 1014 may be adjacent or embedded in the components 1003 defining the mini-environment. A gas flow 1014A is provided from the jet 1014. Exemplary gases provided from the gas jet 1014 include but are not limited to H, He, Ar, N, and/or combinations thereof. In an embodiment, the jet 1014 is similar to the flow from jet 404 in the system 400 of FIG. 4 and/or the flow 904 described above with reference to FIG. 9. As discussed above, in an embodiment, the gas flow 1014A may be less than room temperature. In some implementations, the gas flow 1014A is below room temperature but above the temperature of the gas flow 1012A. In some implementations, the gas flow 1014A is below room temperature but above the temperature of the gas flow 1012A by at least 3 degrees° C. In an embodiment, the gas flow 1014A is provided in a channel of the component 1003 and released into the mini-environment 1004 where it produces a vertical flow upwards and downwards, in some implementations, the vertical flow upwards being greater than downwards.

The mask 12 is positioned such that the radiation beam is incident its surface; the mask 12 being held by the mask stage 16. In some implementations, the mask stage 16 includes thermal regulation components and/or thermal sensors such as discussed above.

The portion of FIG. 10 adjacent the mask 12 may be referred to as a reticle mini-environment. A reticle mini-environment includes the mask or reticle 12 and a mask stage or chuck 16 along with the thermal regulation components such as discussed above with respect to FIGS. 5, 6, 7A, 8A and 9. For example, the thermal regulation components may provide for cooling for one of more regions of the stage 16 and thus, the mask 12.

The reticle mini-environment also includes components that correct, direct, modify, and/or contain the radiation 18 such as reticle masking blades (REMA blades). In some implementations, a gas nozzle such as the first gas nozzle 1012 is positioned in the REMA blades.

Figure 11:
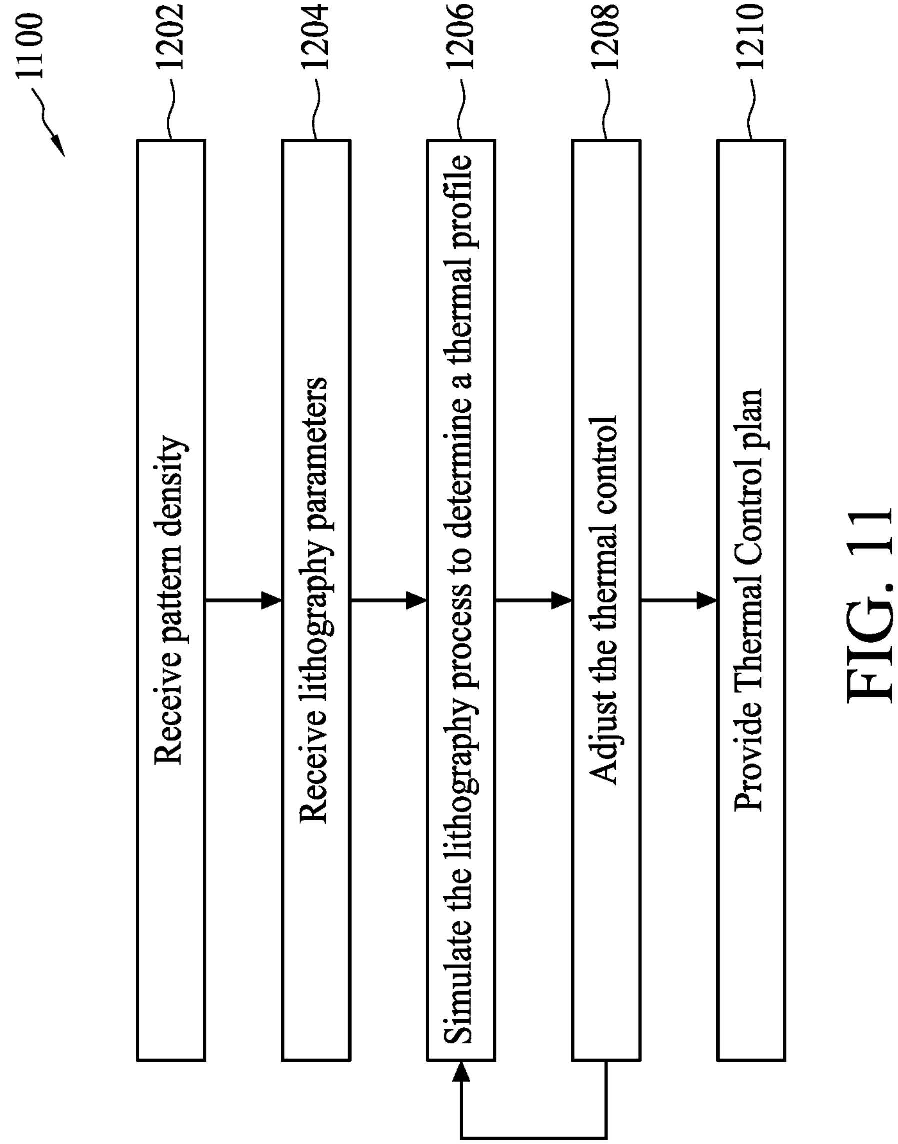
FIG. 11 is a flow chart of an embodiment of a method of developing a thermal control plan in accordance with some aspects of the present disclosure.

Referring now to FIG. 11, illustrated is a method 1100 of providing a thermal control plan. The thermal control plan provided by the method 1100 may be provided to and/or implemented by a lithography tool such as the lithography system 10 of FIG. 1. One or more steps of the method 1100 may be performed by thermal control module 30 also referred to as a controller, discussed above including with reference to FIG. 1.

The method 1100 includes an operation 1202 where pattern density information is received. In an embodiment, the pattern density is gathered from design files associated with a reticle. The design files may be provided in a GDS file format. In an embodiment, the pattern density information may be delineated by regions or zones of a reticle. Exemplary embodiments of the pattern density information are described above with reference to FIGS. 7B and 7C.

The method 1100 includes an operation 1204 where lithography parameters including mask usage information are received. Exemplary parameters include parameters such as equivalent power, exposure times, stepping conditions, scanning times, pulse frequency and width, ambient temperature(s), reticle edge temperatures, stepping duration, and/or other lithography parameters that affect the thermal condition of the reticle and/or its surrounding environment. In an embodiment, an equivalent power of 235 W/cm$^2$ is provided. In an embodiment, a reticle edge temperature is set to approximately 24° C. is provided. In an embodiment, a stepping duration is set to approximately 60-75 milliseconds is provided. In an embodiment, the lithography parameters also include sensor data from the sensors positioned on or around the lithography tool such as temperature data from thermal couples, IR camera/sensor, UV sensor, light sensor, and/or other suitable components.

The method 1100 includes an operation 1206 where a lithography process is simulated using the lithography parameters and pattern density information to determine a thermal profile. The analysis module includes various correlation analysis units that analyze the correlations among various parameters, such as a correlation between the pattern density and the thermal conditions of a reticle and/or its surroundings during exposure, a correlation between the lithography parameters and the thermal conditions of a reticle during exposure, and other correlations. An example of a thermal profile generated is described above with reference to FIG. 8B. The simulation may illustrate a maximum temperature at one or more times during the simulated lithography process (see FIG. 8B). In an embodiment, the maximum temperature is between approximately 280 and 350° C. after a first scan and between 38° and 450° C. after a second scan, a field stepping positioning may occur between the first and second scans. In an embodiment, the simulation may provide a cooling amount during the field stepping. In an embodiment, a cooling of approximately 150 and 300° C. is provided. In an embodiment, a cooling of between approximately 25% and 75% of the raise in temperature provided by the preceding scan is provided during the field stepping. The analysis providing a thermal profile may be performed by a controller such as thermal control module 30.

The analysis of operation 1206 may also include developing a correlation between the thermal profile generated and the outgassing of compositions (e.g., B derivatives such as $BH_3$). In an embodiment, the analysis module utilizes simulation, experimental data, and/or chemical reaction analysis to determine a level of outgassing produced, for example, from an absorption layer defining the pattern density for the give thermal profile. In an embodiment, the analysis module recognizes that a higher thermal profile temperature provides for a greater outgassing.

The method 1200 includes an operation 1208 where a thermal management action is determined. The analysis module may develop a thermal management action or actions that lower a temperature of the mask and/or its surroundings during the lithography process. In an embodiment, the thermal management action includes a setting for one or more thermal regulation components positioned in the mask stage and/or remotely from the reticle (e.g., gas jets). In an embodiment, the thermal management action is sending instructions to the thermal regulation components, which may be substantially similar to as discussed above with reference to the thermal regulation component 408 of FIG. 4 or thermal regulation component 504, 602 of FIGS. 5-9. For example, in some embodiments, the thermal regulation components include a heat exchanger, piping or channels providing coolant, a solid cooling module, thermal piping module(s), and/or other thermal cooling components and/or other thermal management components in the reticle stage or chuck. In an embodiment, the thermal management action is sending instructions to the thermal regulation components of one or more gas jets including a setting for gas flow temperature and/or flow rate from the gas jets. The gas jets may be substantially similar to as discussed above with reference to the gas flows 902, 904, and/or gas jets 1012, 1014. The thermal management action may include instructions to adjust to the thermal regulation components during a given lithography process. For example, the thermal control plan may lower a gas jet temperature during a scanning process and/or provide for additional cooling in a thermal regulation component of the mask stage during the lithography process.

In an embodiment, rather than directly sending instructions, the method 1100 inputs the determined thermal management action to the simulation of operation 1206 to determine the thermal profile in an iterative process.

The method 1100 includes an operation 1210 where thermal control plan instructions are implemented during a lithography process. The implementation may include setting, adjusting or tuning the thermal regulation component of the mask stage and/or the gas jet(s) before and during a lithography process.

It is noted that the method 1100 of FIG. 11 in some implementations provides a thermal control plan prior to the performance of the lithography process. In some embodiments, the thermal control plan is developed during the lithography process. In an implementation, the lithography parameters received in operation 1204 include real-time data of the lithography process such as temperature readings from sensors. Exemplary sensors include thermal couples such as thermal couples 506A, 506B discussed above, and/or remote sensors such as IR modules or sensors 508A, 508B discussed above. The real-time data may be used to determine the thermal control plan as discussed in operation 1210. In some implementations, the method 1100 is performed for each zone of a reticle.

Figure 12:
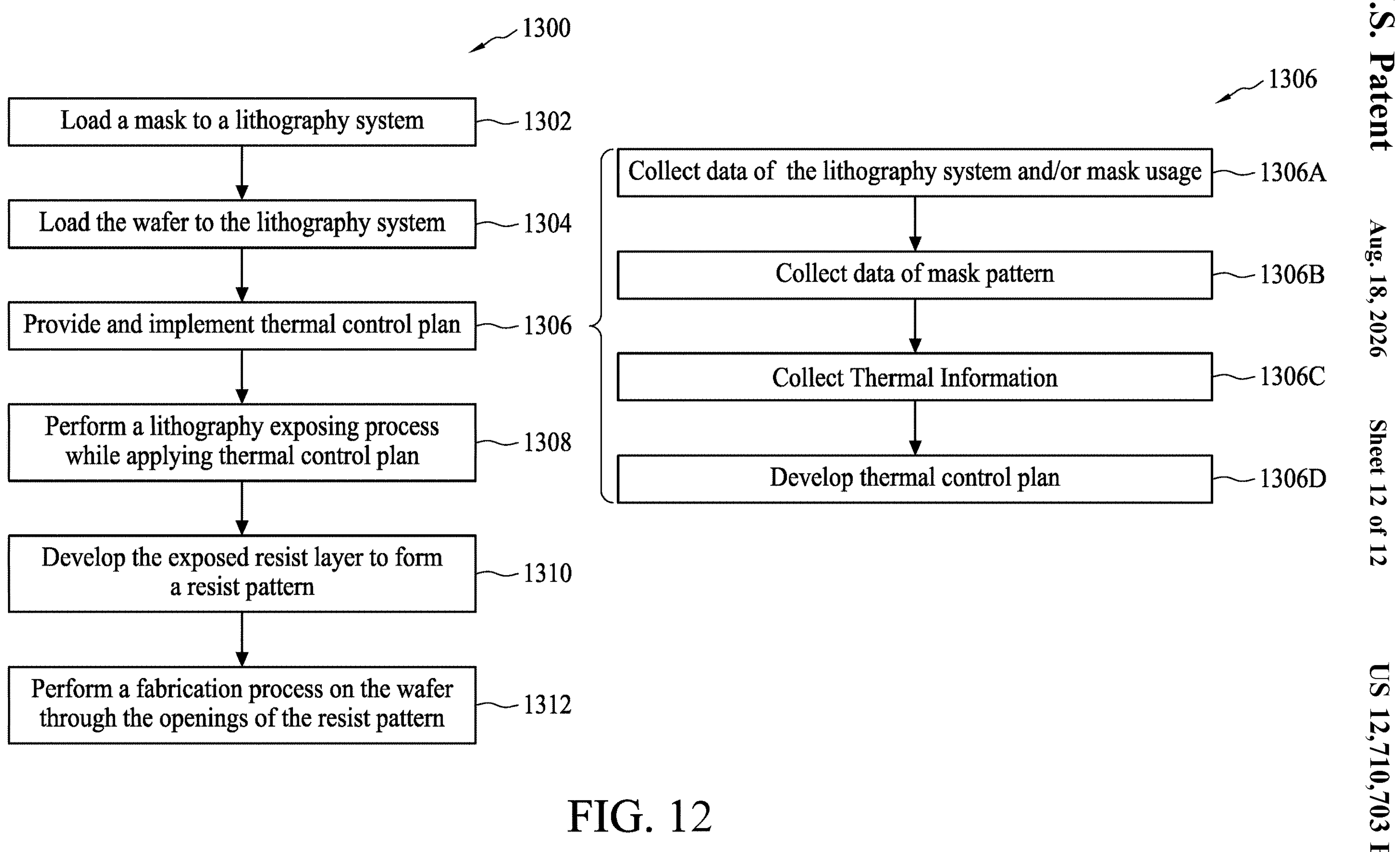
FIG. 12 is a flow chart of an embodiment of performing a lithography process including thermal management according to aspects of the present disclosure.

FIG. 12 illustrates a flowchart of the method 1300 for performing a lithography process. The method 1300 may be implemented by the lithography system 10, described above with reference to FIG. 1 and/or the other systems and tools disclosed herein.

The method 1300 includes an operation 1302 of loading a mask or reticle to a lithography system. In an embodiment, an EUV photomask is loaded to an EUV lithography system that is operable to perform a EUV lithography exposure process. The photomask may be substantially similar to the mask 12 discussed above. The mask includes an IC pattern to be transferred to a target substrate. The operation 1302 may further include various steps, such as securing the photomask on the mask stage and performing an alignment.

The method 1300 includes an operation 1304 of loading a target substrate, such as a semiconductor wafer, to the lithography system. The target substrate is coated with a photoresist layer. In an embodiment, the photoresist layer is sensitive to the EUV radiation.

The method 1300 includes an operation 1306 of providing and implementing a thermal control plan. The thermal control plan may be provided by a thermal control module such as the thermal control module 30 discussed above. Providing the thermal control plan includes receiving information regarding the reticle, the lithography parameters including mask usage, and the temperature of various components. The thermal control plan utilizes this information to implement a thermal management plan which includes thermal management actions of providing directions a thermal regulation component to lower the temperature of the reticle or one or more components of the lithography system. In some embodiments, the thermal control plan determines thermal management actions of sending instructions to a thermal regulation component such as a heat exchanger in a mask holder. In some embodiments, the thermal control plan determines thermal management actions of sending instructions to a thermal regulation component of one or more gas jets of the lithography system. Thus, the implementation of the thermal control plan includes adjusting one or more components (e.g., heat exchanger, gas jets).

In an embodiment, the thermal control plan is provided by operations such as illustrated in the method 1100 described above with reference to FIG. 11. In an embodiment, the thermal control plan is updated during the lithography process based on feedback received such as from temperature sensors. In other words, operation 1306 may occur multiple times during the performance of operation 1308. The thermal control plan may be determined, tuned, and implemented for an entire reticle. In other embodiments, the thermal control plan may be determined, tuned, and implemented for individual zones of a reticle.

FIG. 12 illustrates an embodiment of a plurality of steps that may be included in the operation 1306 to form a thermal control plan. In step 1306A, data of the lithography system such as mask use is collected. The data may be substantially similar to the data described above with reference to the database 802 in FIG. 9. In step 1306B, data of the mask pattern is collected. In an embodiment, the data includes pattern density. The data may be substantially similar to the data described above with reference to the database 802 in FIG. 8 and/or as illustrated in FIGS. 7B, 7C. In step 1306C, thermal information is collected. The thermal information may include receiving a temperature from a first temperature sensing device such as a direct temperature sensing device (e.g., thermal couple). The first received temperature may be associated with the mask holder, for example, from a thermal couple directly positioned on the mask holder. The thermal information may include receiving a temperature from a second temperature sensing device such as a remote temperature sensing device (e.g., IR sensor). The second received temperature may be associated with a reticle, for example, from a remote temperature sensing device directed at the reticle. In some implementations, temperature readings are received from each of a plurality of zones of a reticle. In step 1306D, a thermal control plan is developed. The thermal control plan may be substantially similar to as discussed above and include instructions to a thermal regulation component such as a component in the mask holder (e.g., heat exchanger, coolant) and/or a gas jet (e.g., delivering cooled gas). One or more of the steps 1306A, 1306B, 1306C, 1306D may be omitted.

The method 1300 includes an operation 1308 by performing a lithography exposure process to the wafer in the lithography system. In an embodiment, the operation 1308 is a EUV lithography operation and the laser and the tin droplet generator are synchronized (specifically, laser pulses and tin droplet generation are synchronized) through a suitable mechanism, such as a control circuit with timer to control and synchronize both. The synchronized laser excites the target material droplets and generates plasma, thereby generating the EUV radiation. During the operation 1308, the generated EUV radiation is illuminated on the photomask (by an illuminator such as illumination 20) and is further projected on the resist layer coated on the wafer (by the POB such as optics 22), thereby forming a latent image on the resist layer. In an embodiment, the lithography exposing process is implemented in a scan mode.

Particularly, during the lithography exposure process, various instructions of the thermal management plan developed in operation 1306 may be implemented with the lithography exposure process at the same time or overlapping times. For example, the method 1300 may continue collecting data by the temperature sensors (e.g., temperature readings by thermal couples, IR sensors, or the like) at the operation 1306 and analyzing the collected data by the analysis module to perform and/or adjust the thermal control plan during the exposure of the mask. For example, in an embodiment, a temperature is received from a sensor (e.g., a thermal couple or indirect sensor such as an IR sensor) on a mask holder 16 is received during the lithography process (e.g., during the exposure of the mask to the EUV).

In an implementation, the thermal control management of the method 1300 serves to decrease a temperature of the reticle and/or its surroundings. A decrease in temperature may provide for a decreased outgassing from the reticle layers such as atoms from an absorption layer (e.g., B). In an embodiment, an outgassing of boron is reduced due to the thermal control management. In some embodiments, the reduction of the outgassing of boron reduces the available reactants for forming contaminate compounds in the system including as discussed above in FIG. 3.

The method 1300 may include other operations to complete the lithography patterning process. For example, the method 1300 may include an operation 1310 by developing the exposed photoresist layer to form a photoresist pattern on the substrate having a plurality of openings defined thereon. In one example, the photoresist layer is positive tone; the exposed portion of the photoresist layer is removed by the developing solution. In another example, the photoresist layer is negative tone; the exposed portion of the photoresist layer remains; and the non-exposed portions are removed by the developing solution.

The method 1300 may further include other operations, such as various baking steps. As one example, the method 1300 may include a post-exposure baking (PEB) step between the operations 1310 and 1312. The method 1300 may further include other operations, such as an operation 1312 to perform a fabrication process to the wafer through the openings of the photoresist pattern provided by the method 1300. In one example, the fabrication process includes applying an etch process to the semiconductor substrate or a material layer thereon using the photoresist pattern as an etch mask. In another example, the fabrication process includes performing an ion implantation process to the semiconductor substrate using the photoresist pattern as an implantation mask. After the operation 1312, the photoresist layer may be removed by wet stripping or plasma ashing.

Thus, the present disclosure provides exemplary lithography systems with thermal control modules and methods of performing lithography implementing thermal control management by providing thermal management action or instructions to thermal regulation components such as gas jets and/or mask stage features such as heat exchangers or coolant piping/channels. In some embodiments, the thermal control management accounts for pattern density differences on the mask. In some embodiments, the thermal control management accounts for mask usage such as scanning/stepping times. The thermal control management may serve to lower a temperature of the reticle and/or its surroundings sufficiently to reduce an outgassing of material from the reticle (e.g., absorber layer). The reduction of outgassing can provide for a reduced reticle defect rate by reducing the contaminates in the system.

In one example aspect, the present disclosure provides a method for an extreme ultraviolet (EUV) lithography. The method includes collecting thermal data associated with a reticle during a lithography process. And using the thermal data to determine a thermal management action, wherein the thermal management action includes providing an instruction to a thermal regulation component to cool a reticle.

In a further embodiment, the method includes receiving design data associated with a pattern on the reticle and using the design data to determine the thermal management action. In an embodiment, the method includes receiving a temperature reading from a thermal couple and receiving a temperature reading from an IR sensor. In some implementations, the thermal management action includes providing the instruction to the thermal regulation component of a first gas jet to provide a gas flow. In an embodiment, the gas flow is below approximately 22° C. The method in some embodiments provides the thermal management action as including providing the instruction to the thermal regulation component of a second gas jet to provide another gas flow. The gas flow from the first gas jet may be at least 3° C. colder than the gas flow from the second gas jet. In an embodiment, the thermal management action is providing the instruction to the thermal regulation component of a heat exchanger in a reticle chuck used in the lithography process. The method may include providing the instruction to the heat exchanger such that the instructions are provided to a first component having a coolant in a first portion of the reticle chuck and providing instructions to a second component having a coolant in a second portion of the reticle chuck. The first component and the second component are separately controllable.

In another example aspect, a method of performing lithography is performed. The method includes providing a mask to a mask holder of a lithography tool and providing a target substrate to a wafer stage of the lithography tool. A radiation beam is delivered from a source of the lithography tool. The delivered radiation beam is reflected off of the mask. The method continues to include providing the reflected radiation beam to the target substrate. During the delivering the radiation beam, a thermal control management is performed. The thermal control management includes receiving a temperature associated with the mask holder and receiving a temperature associated with the mask. An output of a thermal regulation component is modified based on the received temperatures.

In a further embodiment, modifying the output of the thermal regulation component includes providing a gas flow having a temperature below 22° C. In some implementations, modifying the output of the thermal regulation component further includes providing a coolant to the mask holder. In an embodiment, the method includes receiving a first temperature associated with a first region of the mask holder and a second temperature associated with a second region of the mask holder. The temperature may be received from an IR sensor. In some embodiments, performing the thermal control management further includes receiving a pattern density of the mask and determining an initial output of the thermal regulation component based on the pattern density.

In yet another example aspect, the present disclosure provides an extreme ultraviolet (EUV) lithography system. The system includes a reticle holder, a temperature sensor, a first thermal regulation component, a second thermal regulation component, and a control module. The first thermal regulation component is operable to lower a temperature of a reticle in the reticle holder. The second thermal regulation component is operable to provide a gas flow adjacent a reticle in the reticle holder. The control module is coupled to the temperature sensor, the first thermal regulation component and the second thermal regulation component.

In an embodiment, the temperature sensor includes a first thermal couple on a first region of the reticle holder and a second thermal couple on a second region of the reticle holder. In an embodiment, the temperature sensor further includes at least one remote temperature sensing device. In an implementation, at least one remote temperature sensing device includes a first IR sensor directed to sensing a temperature of a first region of a reticle in the reticle holder and a second IR sensor directed to sensing a temperature of a second region of the reticle in the reticle holder. In an embodiment, the system further includes another temperature regulation component adjacent the first thermal regulation component, wherein the another thermal regulation component is operable to cool a first region of a reticle in the reticle holder and the first thermal regulation component is operable to cool a second region of the reticle in the reticle holder.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of performing lithography, wherein the method includes:

providing a mask to a mask holder of a lithography tool;

providing a target substrate to a wafer stage of the lithography tool;

delivering a radiation beam from a source of the lithography tool, wherein the delivered radiation beam is reflected off of the mask;

providing the reflected radiation beam to the target substrate; and during the delivering the radiation beam, performing a thermal control management, wherein the thermal control management includes:

receiving a temperature associated with the mask holder from a first temperature measurement device, receiving a temperature associated with the mask from a second temperature measurement device, modifying an output of a thermal regulation component based on the received temperatures, wherein the modifying the output includes determining a gas flow.

2. The method of claim 1, wherein the the first temperature measurement device is a thermal couple; and the second temperature measurement device is an infrared (IR) sensor.

3. The method of claim 1, wherein the modifying the output of the thermal regulation component includes determining a temperature of the gas flow temperature of below 22° C.

4. The method of claim 3, wherein the modifying the output of the thermal regulation component further includes providing a coolant to the mask holder.

5. The method of claim 1, wherein the first temperature measurement device is positioned on the mask holder and receiving the temperature associated with the mask holder includes receiving a first temperature associated with a first region of the mask holder and a second temperature associated with a second region of the mask holder.

6. The method of claim 1, wherein the second temperature measurement device is an infrared (IR) sensor, and the first temperature measurement device is positioned on the mask holder.

7. The method of claim 1, wherein the performing the thermal control management further includes:

receiving a pattern density of the mask; and determining an initial output of the thermal regulation component based on the pattern density.

8. The method of claim 1, wherein the radiation is extreme ultraviolet radiation wavelength.

9. The method of claim 1, wherein the thermal control management also includes providing instruction to a heat exchanger in a reticle chuck used in the lithography process.

10. The method of claim 9, wherein the providing the instruction to the heat exchanger includes providing instructions to a first component having a coolant in a first portion of the reticle chuck and providing instructions to a second component having a coolant in a second portion of the reticle chuck, wherein the first component and the second component are separately controllable.

11. A method of performing lithography, wherein the method includes:

providing a mask and a target substrate to a lithography tool;

delivering a radiation beam to the mask, wherein the delivered radiation beam is reflected off of the mask;

providing the reflected radiation beam to the target substrate; and during the delivering the radiation beam, performing a thermal control management, wherein the thermal control management includes:

receiving a temperature associated with an environment of the mask, wherein the temperature associated with the environment of the mask is received from a direct sensing component;

receiving a temperature associated with the mask, wherein the temperature associated with the mask is received from an indirect sensing component; and modifying an output of a thermal regulation component based on both of the received temperatures, wherein the modifying the output includes determining a gas flow.

12. The method of claim 11, wherein the direct sensing component is a thermal couple and the indirect sensing component is an infrared (IR) sensor.

13. The method of claim 11, further comprising: receiving design data associated with a pattern on the mask; and using the design data to determine the modifying the output of the thermal regulation component.

14. The method of claim 11, where the modifying the output of the thermal regulation component further includes providing a coolant to a mask holder included in the environment of the mask, wherein the coolant is at least one of a liquid or a gas.

15. The method of claim 1, wherein the determining the gas flow is providing instruction to a first gas jet to provide the gas flow.

16. The method of claim 15, wherein the gas flow is below approximately 22° C.

17. The method of claim 15, wherein the determining the gas flow includes providing instruction to a second gas jet to provide another gas flow.

18. The method of claim 17, wherein the gas flow from the first gas jet is at least 3° C. colder than the gas flow from the second gas jet.

* * * * *